(12) United States Patent
Lim et al.

(10) Patent No.: US 11,322,578 B2
(45) Date of Patent: May 3, 2022

(54) SEMICONDUCTOR DEVICE

(71) Applicant: Samsung Electronics Co., Ltd., Suwon-si (KR)

(72) Inventors: Han Jin Lim, Seoul (KR); Ki Nam Kim, Seoul (KR); Hyung Suk Jung, Suwon-si (KR); Kyoo Ho Jung, Seoul (KR); Ki Hyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 106 days.

(21) Appl. No.: 16/590,565

(22) Filed: Oct. 2, 2019

(65) Prior Publication Data
US 2020/0286985 A1 Sep. 10, 2020

(30) Foreign Application Priority Data
Mar. 6, 2019 (KR) .......................... 10-2019-0025713

(51) Int. Cl.
*H01L 49/02* (2006.01)
*H01L 21/02* (2006.01)
(Continued)

(52) U.S. Cl.
CPC ........ *H01L 28/56* (2013.01); *H01L 21/02181* (2013.01); *H01L 21/02189* (2013.01);
(Continued)

(58) Field of Classification Search
CPC ... H01L 28/56; H01L 28/75; H01L 21/02197; H01L 21/02181; H01L 21/02189;
(Continued)

(56) References Cited

U.S. PATENT DOCUMENTS 8,183,594 B2 * 5/2012 Ishida ..................... H01L 41/08
257/190
10,128,327 B2 11/2018 Zhang
(Continued)

FOREIGN PATENT DOCUMENTS

| KR | 2004-0059827 A | 7/2004 |
| KR | 100717824 B1 | 5/2007 |
| KR | 101116166 B1 | 3/2012 |

*Primary Examiner* — Bac H Au
(74) *Attorney, Agent, or Firm* — Harness, Dickey & Pierce, P.L.C.

(57) ABSTRACT

There is provided a semiconductor device capable of improving the performance and/or reliability of the element, by increasing the capacitance of the capacitor, using a capacitor dielectric film including a ferroelectric material and a paraelectric material. The semiconductor device includes first and second electrodes disposed to be spaced apart from each other, and a capacitor dielectric film disposed between the first electrode and the second electrode and including a first dielectric film and a second dielectric film. The first dielectric film includes one of a first mono-metal oxide film and a first bimetal oxide film, the first dielectric film has an orthorhombic crystal system, the second dielectric film includes a paraelectric material, and a dielectric constant of the capacitor dielectric film is greater than a dielectric constant of the second dielectric film.

20 Claims, 25 Drawing Sheets

(51) Int. Cl.
  *H01L 21/28* (2006.01)
  *H01L 27/11507* (2017.01)
  *H01L 27/108* (2006.01)

(52) U.S. Cl.
  CPC .. *H01L 21/02192* (2013.01); *H01L 21/02197* (2013.01); *H01L 21/28247* (2013.01); *H01L 27/11507* (2013.01); *H01L 27/108* (2013.01)

(58) Field of Classification Search
  CPC ......... H01L 21/02172; H01L 27/11502; H01L 27/11507; H01L 27/10855; H01L 27/10808; H01L 27/10805; H01L 27/10847
  See application file for complete search history.

(56) References Cited

U.S. PATENT DOCUMENTS

| | | | |
|---|---|---|---|
| 10,153,155 B2 | 12/2018 | Nishida et al. | |
| 11,063,112 B2 * | 7/2021 | Zhang | H01L 27/108 |
| 2008/0001254 A1 * | 1/2008 | Wang | H01L 21/02164 |
| | | | 257/532 |
| 2015/0340372 A1 | 11/2015 | Pandey et al. | |
| 2015/0380641 A1 * | 12/2015 | Ino | C01G 27/00 |
| | | | 257/4 |
| 2018/0337055 A1 | 11/2018 | Yamaguchi | |
| 2019/0131426 A1 * | 5/2019 | Lu | H01L 29/66795 |
| 2019/0164850 A1 * | 5/2019 | Lin | G01R 27/2617 |
| 2021/0028273 A1 * | 1/2021 | Yoon | C23C 16/34 |

* cited by examiner

SEMICONDUCTOR DEVICE

This application claims priority to Korean Patent Application No. 10-2019-0025713, filed on Mar. 6, 2019, and all the benefits accruing therefrom under 35 U.S.C. § 119, the disclosure of which is incorporated herein by reference in its entirety.

BACKGROUND

1. Technical Field

The present inventive concepts relate to a semiconductor device, and more particularly, to a semiconductor device that uses a capacitor as a data storage element.

2. Description of the Related Art

In recent years, semiconductor elements have been increased in capacity and/or integration, and design rules have also decreased. Such a tendency is also shown in a DRAM which is one of memory semiconductor elements. A certain level or more of capacitance (electrostatic capacity) is required for each cell in order for the DRAM device to operate.

The increase in capacitance increases an amount of charge stored in the capacitor to improve the refresh characteristics of the semiconductor device. The improved refresh characteristics of the semiconductor device may improve the yield of the semiconductor device.

In order to increase the capacitance, methods of utilizing a dielectric film having a high dielectric constant for a capacitor or increasing a contact area between a lower electrode of the capacitor and a dielectric film have been studied.

SUMMARY

Aspects of the present inventive concepts provide a semiconductor device capable of improving the performance and reliability of the element, by increasing the capacitance of the capacitor, using a capacitor dielectric film including a ferroelectric material and a paraelectric material.

However, aspects of the present inventive concepts are not restricted to the one set forth herein. The above and other aspects of the present inventive concepts will become more apparent to one of ordinary skill in the art to which the present inventive concepts pertain by referencing the detailed description of the present inventive concepts given below.

According to an aspect of the present inventive concepts, there is provided a semiconductor device comprising first and second electrodes apart from each other, and a capacitor dielectric film between the first electrode and the second electrode and including a first dielectric film and a second dielectric film. The first dielectric film includes one of a first monometal oxide film and a first bimetal oxide film, the first dielectric film has an orthorhombic crystal system, the second dielectric film includes a paraelectric material, and a dielectric constant of the capacitor dielectric film is greater than a dielectric constant of the second dielectric film.

According to an aspect of the present inventive concepts, there is provided a semiconductor device comprising first and second electrodes apart from each other, a capacitor dielectric film between the first electrode and the second electrode, and including a first dielectric film and a second dielectric film, the first dielectric film including a ferroelectric material, the second dielectric film including a paraelectric material and between the first dielectric film and the first electrode, and at least one interfacial film including a conductive material and being in contact with the first dielectric film.

According to an aspect of the present inventive concepts, there is provided a semiconductor device comprising a first insulation pattern including a first sidewall and a second sidewall adjacent to each other on a substrate, a second insulation pattern separate from the first insulation pattern on the substrate and including a third sidewall and a fourth sidewall adjacent to each other, the fourth sidewall of the second insulation pattern facing the second sidewall of the first insulation pattern, a first lower electrode extending along the first sidewall of the first insulation pattern and not extending along the second sidewall of the first insulation pattern, a second lower electrode extending along the third sidewall of the second insulation pattern and not extending along the fourth sidewall of the second insulation pattern, a capacitor dielectric film extending along the first lower electrode, the second lower electrode, the second sidewall of the first insulation pattern and the fourth sidewall of the second insulation pattern, and including a first dielectric film and a second dielectric film, and an upper electrode on the capacitor dielectric film. The first dielectric film includes one of a monometal oxide film and a bimetal oxide film, the second dielectric film includes a paraelectric material, and a dielectric constant of the capacitor dielectric film is greater than a dielectric constant of the second dielectric film.

According to an aspect of the present inventive concepts, there is provided a semiconductor device comprising first and second electrodes apart from each other, and a capacitor dielectric film between the first electrode and the second electrode and including a first dielectric film and a second dielectric film, the first dielectric film being between the second dielectric film and the first electrode. Each of the first dielectric film and the second dielectric film includes a metal oxide film, a metal contained in the metal oxide film is contained in a transition metal of group 4 (IV B) of a periodic table, and a capacitance of the capacitor dielectric film is greater than a capacitance of the second dielectric film.

According to an aspect of the present inventive concepts, there is provided a semiconductor device comprising first and second electrodes apart from each other, and a capacitor dielectric film between the first electrode and the second electrode, and including a first dielectric film and a second dielectric film. The first dielectric film includes a monometal oxide film having an orthorhombic crystal system, the second dielectric film includes a paraelectric material, and a capacitance of the capacitor dielectric film is greater than a capacitance of the second dielectric film.

According to an aspect of the present inventive concepts, there is provided a semiconductor device comprising a first insulation pattern including a first sidewall and a second sidewall adjacent to each other on a substrate, a second insulation pattern separate from the first insulation pattern on the substrate and including a third sidewall and a fourth sidewall adjacent to each other, the fourth sidewall of the second insulation pattern facing the second sidewall of the first insulation pattern, a first lower electrode extending along the first sidewall of the first insulation pattern and not extending along the second sidewall of the first insulation pattern, a second lower electrode extending along the third sidewall of the second insulation pattern and not extending along the fourth sidewall of the second insulation pattern, a capacitor dielectric film extending along the first lower electrode, the second lower electrode, the second sidewall of the first insulation pattern and the fourth sidewall of the second insulation pattern, and including a first dielectric film and a second dielectric film, at least one or more interfacial films including a conductive material and being in contact with the first dielectric film, and an upper electrode on the capacitor dielectric film. The first dielectric film includes a ferroelectric material, and the second dielectric film includes a paraelectric material.

BRIEF DESCRIPTION OF THE DRAWINGS

The above and other aspects and features of the present inventive concepts will become more apparent by describing in detail exemplary embodiments thereof with reference to the attached drawings, in which:

FIG. 2b is a circuit diagram corresponding to the semiconductor device of FIG. 2a;

FIG. 23b is a diagram illustrating a state in which a capacitor dielectric film and an upper electrode are removed from FIG. 23a.

DETAILED DESCRIPTION OF SOME EMBODIMENTS

Figure 1:
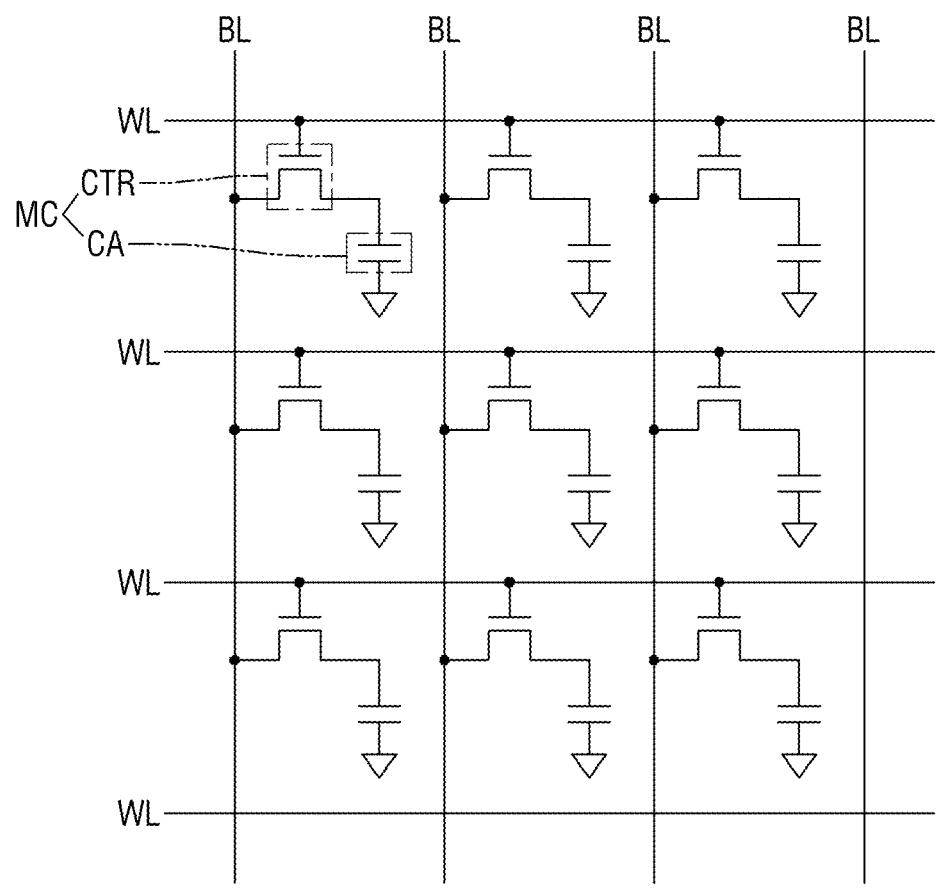
FIG. 1 is a circuit diagram of a memory cell array of a semiconductor device according to some embodiments.

FIG. 1 is a circuit diagram of a memory cell array of a semiconductor device according to some embodiments.

Referring to FIG. 1, the memory cell array may include, for example, a DRAM cell array.

The memory cell array may include word lines WL, bit lines BL intersecting the word lines WL, and/or a plurality of memory cells MC. The memory cells MC may be connected to the corresponding word line WL among the word lines WL and the corresponding bit line BL among the bit lines BL.

Each of the memory cells MC may include a cell transistor CTR connected to the corresponding word line WL and/or a capacitor CA connected to one terminal of the cell transistor CTR.

A drain region of the cell transistor CTR may be connected to the corresponding bit line BL, and a source region of the cell transistor CTR may be connected to the capacitor CA. The cell transistor CTR may be configured to selectively control the flow of charge flowing to the capacitor CA. The memory cells MC may store data of 0 or 1, depending on the presence or absence of the charge stored in the capacitor CA, respectively.

Figure 2A:
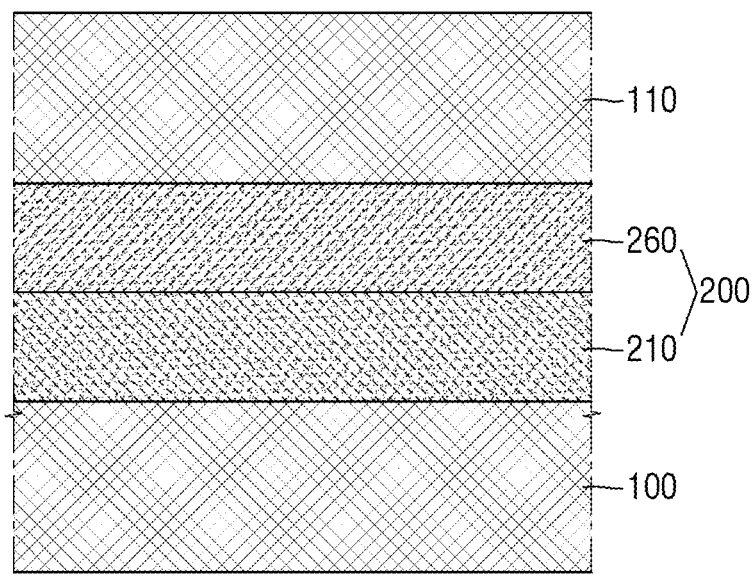
FIG. 2a is a diagram illustrating the semiconductor device of some embodiments.
Figure 2B:
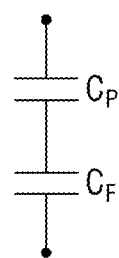

FIG. 2a is a diagram illustrating the semiconductor device in some embodiments. FIG. 2b is a circuit diagram corresponding to the semiconductor device of FIG. 2a. The semiconductor device described in FIG. 2a may be placed at a location of the capacitor CA of the memory cell MC of FIG. 1.

Referring to FIGS. 2a and 2b, the semiconductor device according to some embodiments may include a first electrode 100, a second electrode 110, and/or a first capacitor dielectric film 200.

The first electrode 100 may include, but is not limited to, for example, a doped semiconductor material, conductive metal nitride (e.g., titanium nitride, tantalum nitride, niobium nitride, tungsten nitride or the like), a metal (e.g., ruthenium, iridium, titanium, tantalum or the like), conductive metal oxide (e.g., iridium oxide or niobium oxide), and the like.

The first capacitor dielectric film 200 may be disposed on the first electrode 100. The first capacitor dielectric film 200 may be disposed between the first electrode 100 and the second electrode 110.

The first capacitor dielectric film 200 may include a first ferroelectric film 210 and a first paraelectric film 260. The first ferroelectric film 210 and the first paraelectric film 260 may be sequentially stacked between the first electrode 100 and the second electrode 110. The first ferroelectric film 210 may be disposed between the first electrode 100 and the first paraelectric film 260. The first paraelectric film 260 may be disposed between the first ferroelectric film 210 and the second electrode 110.

As an example, the first electrode 100 may be a lower electrode of the capacitor, and the second electrode 110 may be an upper electrode of the capacitor. As another example, the first electrode 100 may be an upper electrode of the capacitor, and the second electrode 110 may be a lower electrode of the capacitor.

The first ferroelectric film 210 may include a ferroelectric material. The first ferroelectric film 210 may include a first monometal oxide. The first ferroelectric film 210 may include a metal oxide film, for example, a first monometal oxide film. In some embodiments, the monometal oxide may be a binary compound including or consisting of a single metal and oxygen.

As an example, the metal contained in the first monometal oxide film may be hafnium (Hf). The first monometal oxide film may be a hafnium oxide film (HfO). In some embodiments, the hafnium oxide film may have a chemical formula suitable for stoichiometry, or may have a chemical formula not suitable for stoichiometry.

As another example, the metal contained in the first monometal oxide film may be any of rare earth metals of the lanthanoids. The first monometal oxide film may be a rare earth metal oxide film of lanthanoid. In some embodiments, the rare earth metal oxide film of lanthanoid may have a chemical formula suitable for the stoichiometry, or may have a chemical formula not suitable for the stoichiometry.

The first monometal oxide film may include one of hafnium and the rare earth metal of lanthanoid. The first monometal oxide film may be one of a hafnium oxide film or a rare earth metal oxide film of lanthanoid.

The first ferroelectric film 210 may have an orthorhombic crystal system. The first ferroelectric film 210 may be a first monometal oxide film having the orthorhombic crystal system.

As an example, the first ferroelectric film 210 may further include a dopant doped in the first monometal oxide film. The dopant may serve to stabilize the first monometal oxide film having the orthorhombic crystal system. A doping concentration may be less than 10%.

As an example, when the first monometal oxide film is a hafnium oxide film, the dopant may include at least one of gadolinium (Gd), silicon (Si), aluminum (Al), yttrium (Y), lanthanum (La), scandium (Sc), cerium (Ce), dysprosium (Dy), tantalum (Ta), strontium (Sr), and niobium (Nb). As another example, when the first monometal oxide film is a rare earth metal oxide film of lanthanoid, the dopant may include at least one of silicon (Si), aluminum (Al), hafnium (Hf), zirconium (Zr) and niobium (Nb).

As another example, the first monometal oxide film may not contain dopants doped in the film.

In the semiconductor device according to some embodiments of the present inventive concepts, the first ferroelectric film 210 may be a single film including or consisting of a first monometal oxide film. When the first ferroelectric film 210 is a single film and the first monometal oxide film is the hafnium oxide film, the hafnium oxide film may have ferroelectric characteristics in a range of a thickness of hafnium oxide film from 3 nm or more to 5 nm or less.

In some embodiments, the single film may mean that the materials contained in the film have the same crystal system, while having one chemical formula.

The first paraelectric film 260 may include the paraelectric material. The first paraelectric material may include a monometal oxide or a bimetal oxide. The first paraelectric film 260 may include a metal oxide film, for example, a second monometal oxide film or a first bimetal oxide film. In some embodiments, the bimetal oxide may be a ternary compound including or consisting of two metals and oxygen.

The metal contained in the second monometal oxide film and the first bimetal oxide may be contained in the transition metal of group 4 (IV B) of the periodic table. The transition metal of group 4 (IV B) of the periodic table may include at least one of hafnium (Hf) and zirconium (Zr).

The metal contained in the second monometal oxide film may be, for example, one of hafnium (Hf) and zirconium (Zr). The second monometal oxide film may be one of a hafnium oxide film (HfO) and a zirconium oxide film (ZrO).

The metal contained in the first bimetal oxide film may be, for example, hafnium (Hf) and zirconium (Zr). The first bimetal oxide film may be a hafnium zirconium oxide film (HfZrO). The hafnium zirconium oxide film (HfZrO) may be a solid solution of hafnium oxide (HfO) and zirconium oxide (ZrO).

In some embodiments, each of the hafnium oxide film (HfO), the zirconium oxide film (ZrO) and the hafnium zirconium oxide film (HfZrO) may have chemical formulas suitable for the stoichiometry, and may have chemical formulas not suitable for the stoichiometry.

When the first ferroelectric film 210 contains a hafnium oxide film, the metal oxide film contained in the first ferroelectric film 210 and the metal oxide film contained in the first paraelectric film 260 may include at least one of hafnium (Hf) and zirconium (Zr), which are transition metals of group 4 (IV B) of the periodic table, respectively.

When the first paraelectric film 260 is a hafnium oxide film or a hafnium zirconium oxide film, the first paraelectric film 260 may have one crystal system among a monoclinic crystal system, a tetragonal crystal system, and a cubic crystal system. When the first paraelectric film 260 is a zirconium oxide film, the first paraelectric film 260 may have one crystal system among a monoclinic crystal system, an orthorhombic crystal system, a tetragonal crystal system, and a cubic crystal system.

In the semiconductor device according to some embodiments of the present inventive concepts, the first paraelectric film 260 may be a single film including or consisting of a second monometal oxide film, or a single film including or consisting of a first bimetal oxide film.

For example, the first ferroelectric film 210 may be a hafnium oxide film having an orthorhombic crystal system, and the first paraelectric film 260 may be a hafnium oxide film having a monoclinic crystal system. At this time, even if the first ferroelectric film 210 is in contact with the first paraelectric film 260, the stacked first ferroelectric film 210 and the first paraelectric film 260 may not constitute a single film. In other words, the stacked first ferroelectric film 210 and the first paraelectric film 260 may be a stacked film in which single films different from each other are stacked.

In the semiconductor devices according to some embodiments of the present inventive concepts, the first ferroelectric film 210 may be in contact with the first paraelectric film 260.

In FIGS. 2a and 2b, the first ferroelectric film 210 may be included in a ferroelectric capacitor $C_F$, and the first paraelectric film 260 may be included in a paraelectric capacitor $C_P$. That is, the first ferroelectric film 210 may be a capacitor dielectric film of the ferroelectric capacitor $C_F$, and the first paraelectric film 260 may be a capacitor dielectric film of the paraelectric capacitor $C_P$.

The ferroelectric capacitor $C_F$ and the paraelectric capacitor $C_P$ are connected in series. That is, the capacitor including the first capacitor dielectric film 200 may be equivalent to the ferroelectric capacitor $C_F$ and the paraelectric capacitor $C_P$ connected in series.

In the semiconductor device according to some embodiments of the present inventive concepts, the first capacitor dielectric film 200 in which the first ferroelectric film 210 and the first paraelectric film 260 are stacked in a plate shape may exhibit the characteristics of the paraelectric material.

If two or more capacitors are connected in series and the capacitances of each capacitor have a positive value, the overall capacitance becomes smaller than the capacitance of each individual capacitor. In other words, the dielectric constant of a capacitor dielectric film contained in a capacitor that is equivalent to two or more capacitors connected in series is smaller than the dielectric constant of a capacitor dielectric film contained in the individual capacitor.

However, if, for example, one of the capacitances of the two capacitors connected in series has a negative value, the overall capacitance may be greater than the respective individual capacitances, while having a positive value. In order for the overall capacitance value to have a positive value, an absolute value of the capacitance having a negative value should be greater than or equal to the capacitance having a positive value.

In some embodiments of the present inventive concepts, the ferroelectric capacitor $C_F$ and the paraelectric capacitor $C_P$ are connected in series. However, the capacitance of the first capacitor dielectric film 200 is greater than the capacitance of the first paraelectric film 260. That is, the capacitance of the first capacitor dielectric film 200 is greater than the capacitance of the paraelectric capacitor $C_P$.

In other words, the dielectric constant of the first capacitor dielectric film 200 is greater than the dielectric constant of the first paraelectric film 260.

For example, the ferroelectric capacitor $C_F$ including the first ferroelectric film 210 having a negative dielectric constant may have a negative capacitance. The paraelectric capacitor $C_P$, which includes the first paraelectric film 260 having a positive dielectric constant, may have a positive capacitance.

Also, an absolute value of the capacitance of the ferroelectric capacitor $C_F$ including the first ferroelectric film 210 may be greater than an absolute value of the capacitance of the paraelectric capacitor $C_P$ including the first paraelectric film 260. In other words, the absolute value of the dielectric constant of the first ferroelectric film 210 may be greater than the absolute value of the dielectric constant of the first paraelectric film 260.

In such a case, the ferroelectric capacitor $C_F$ and the paraelectric capacitor $C_P$ are connected in series, but the capacitance of the first capacitor dielectric film 200 may be greater than the capacitance of the first paraelectric film 260.

In addition, as the absolute value of the capacitance of the ferroelectric capacitor $C_F$ is greater than the absolute value of the capacitance of the paraelectric capacitor $C_P$, and a difference between the absolute value of the capacitance of the ferroelectric capacitor $C_F$ and the absolute value of the capacitance of the paraelectric capacitor $C_P$ decreases, the overall capacitance of the ferroelectric capacitor $C_F$ and the paraelectric capacitor $C_P$ connected in series may increase.

This will be described below in detail with reference to FIGS. 3 to 4c.

The second electrode 110 may be disposed on the first capacitor dielectric film 200. The second electrode 110 may be disposed to be spaced apart from the first electrode 100. For example, the second electrode 110 may include, but is not limited to, doped semiconductor materials, conductive metal nitrides (e.g., titanium nitride, tantalum nitride, niobium nitride or tungsten nitride), metals (e.g., ruthenium, iridium, titanium or tantalum), and conductive metal oxides (e.g., iridium oxide or niobium oxide).

Figure 3:
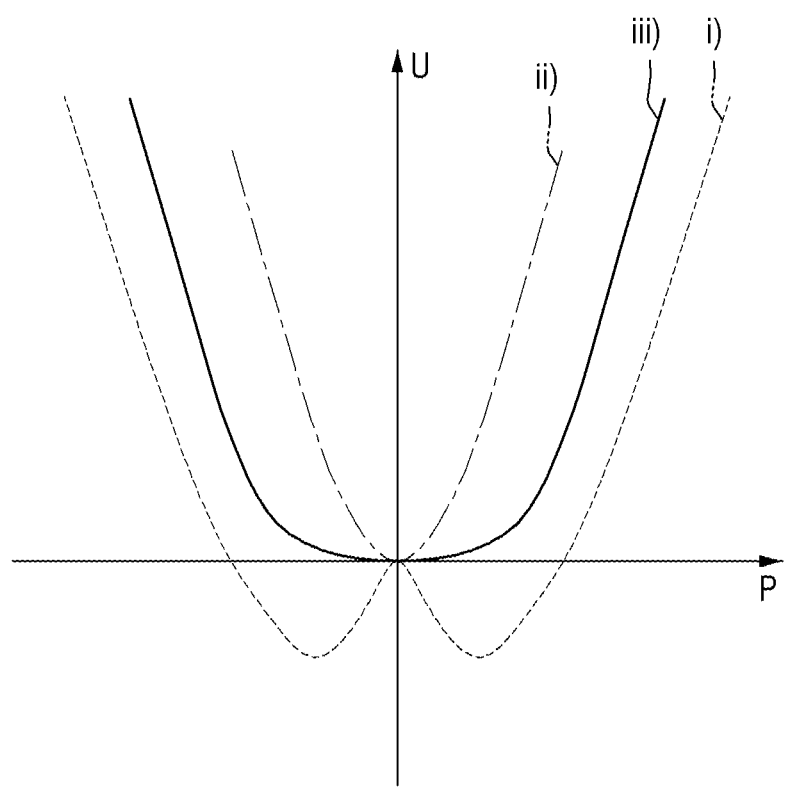
FIG. 3 is a free energy-polarization curve of the ferroelectric material, the paraelectric material, and the stacked ferroelectric material and paraelectric material.
Figure 4A:
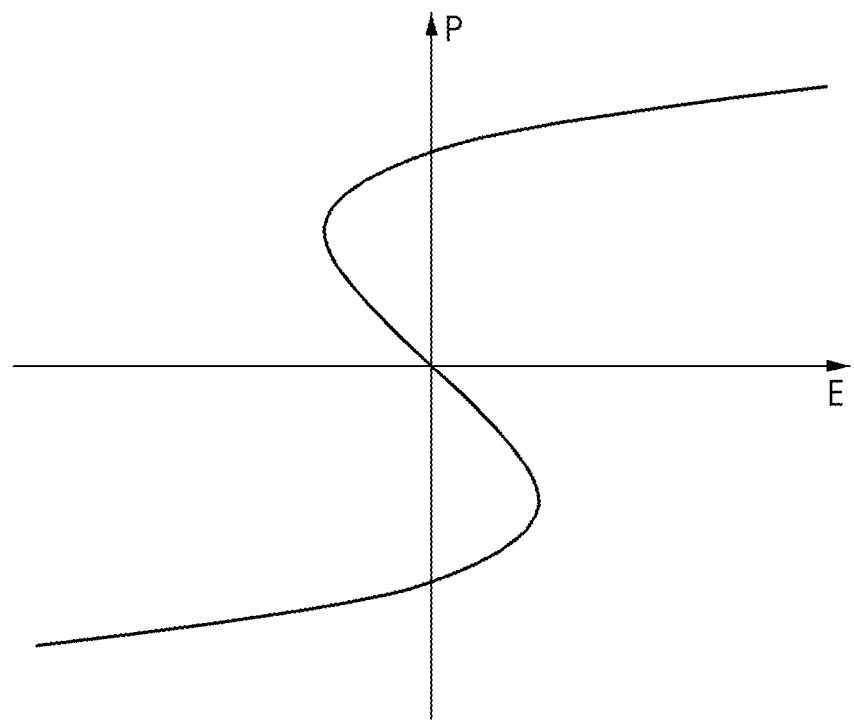
FIG. 4a is a polarization-electric field curve of the ferroelectric material in a single domain state.
Figure 4B:
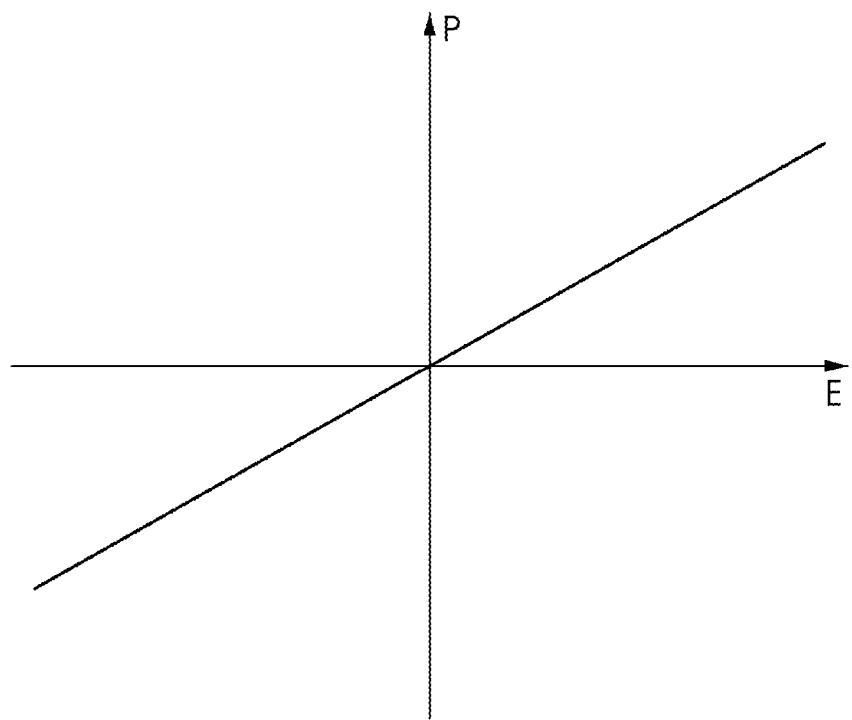
FIG. 4b is a polarization-electric field curve of the paraelectric material.

FIG. 3 is a free energy-polarization curve of the ferroelectric material, the paraelectric material, and the stacked ferroelectric material and paraelectric material. FIG. 4a is a polarization-electric field curve of the ferroelectric material in a single domain state. FIG. 4b is a polarization-electric field curve of the paraelectric material. FIG. 4c is a polarization-electric field curve of the stacked ferroelectric material and paraelectric material.

In FIG. 3, a curve i) may be a free energy-polarization curve of the ferroelectric material, a curve ii) is a free energy-polarization curve of the paraelectric material, and a curve iii) is a free energy-polarization curve of the stacked ferroelectric material and paraelectric material. An axis U may represent the free energy and an axis P may represent the polarization.

Referring to FIGS. 3 and 4a, the ferroelectric material may have two stable polarization states when there is no electric field. The ferroelectric material may have two spontaneous polarizations when there is no electric field.

A relationship between the polarization and the electric field of the ferroelectric material as illustrated in FIG. 4a may be obtained using the curve i) of FIG. 3. In FIG. 4a, an axis E represents the electric field and an axis P represents the polarization.

When drawing a polarization-electric field graph of the ferroelectric material, the polarization-electric field graph of the ferroelectric material may have an S-shaped curve. The dielectric constant of the material may be proportional to a slope (dP/dE) of the polarization-electric field curve. That is, considering the definition of capacitance, the capacitance may be proportional to the slope (dP/dE) of the polarization-electric field curve.

The polarization-electric field graph of the ferroelectric material includes a region which the slope (dP/dE) of the polarization-electric field curve is negative. In the region in which the slope (dP/dE) of the polarization-electric field curve is negative, the capacitor may have a negative capacitance.

The region in which the slope (dP/dE) of the polarization-electric field curve is negative is a region in which the free energy curve of the ferroelectric material has a maximum value. Since the energy state is unstable in this region, it may be difficult to maintain such a polarization state.

Referring to FIGS. 3 and 4b, when the polarization of the paraelectric material is zero, the free energy of the paraelectric material is reduced or minimized, so that the paraelectric material may have one stable polarization state.

A relationship between the polarization and the electric field of the paraelectric as illustrated in FIG. 4b may be obtained, using the curve ii) of FIG. 3. When the polarization-electric field graph of the paraelectric material is drawn, the polarization-electric field graph of the paraelectric material may be a straight line with a positive slope.

Figure 4C:
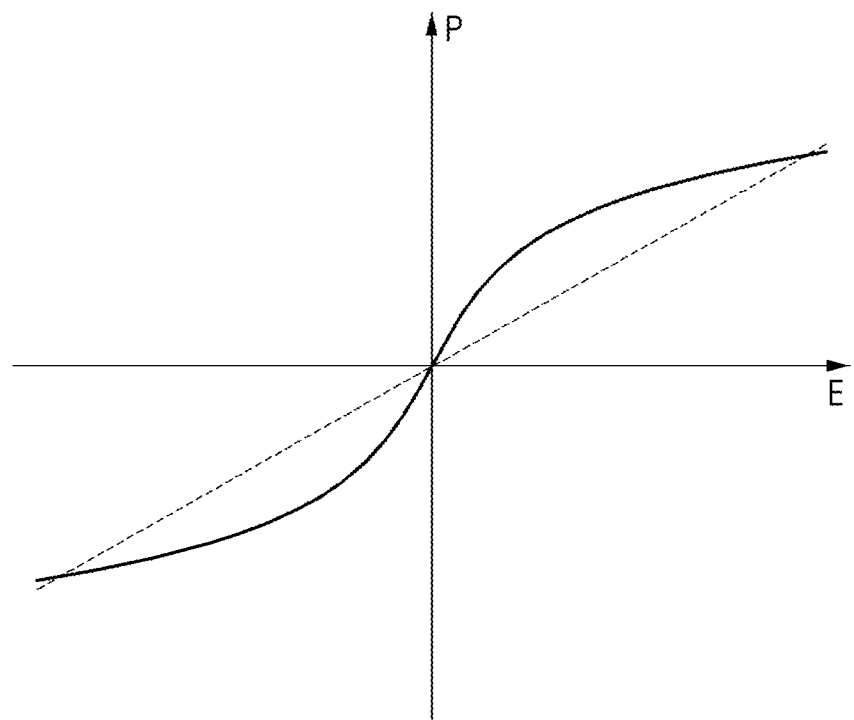
FIG. 4c is a polarization-electric field curve of the stacked ferroelectric material and paraelectric material.

Referring to FIGS. 3 and 4c, by stacking the ferroelectric material and the paraelectric material, the region having the negative capacitance in the ferroelectric material may be stabilized by the paraelectric material. In the overall free energy curve of the stacked ferroelectric material and paraelectric material, the overall free energy may be reduced or minimized when the polarization is zero.

A relationship between the polarization and the electric field of the stacked paraelectric material and ferroelectric material as illustrated in FIG. 4c may be obtained, using the curve iii) of FIG. 3. In FIG. 4c, the dotted line is the polarization-electric field curve of the paraelectric material (FIG. 4b).

Since the ferroelectric material and the paraelectric material are stacked, the slope (dP/dE) of the polarization-electric field graph of the stacked ferroelectric material and paraelectric material may have a positive value, even in the region in which the ferroelectric material has a negative capacitance. In the region in which the ferroelectric material has a negative capacitance, the slope of the polarization-electric field graph of the stacked ferroelectric material and paraelectric material is greater than the slope of the polarization-electric field graph of the paraelectric material.

By connecting the ferroelectric material having a negative capacitance and the paraelectric material having the positive capacitor in series, a stacked film of the ferroelectric material and the paraelectric material may exhibit characteristics of the paraelectric material. Thus, although the capacitors are connected in series, the capacitance may increase.

In the region in which the slope (dP/dE) of the polarization-electric field curve of the ferroelectric material is negative, the polarization-electric field curve may have a first slope, and the polarization-electric field curve of the paraelectric material may have a second slope. When the sum of a half of the first slope and the second slope is greater than zero, the stacked material of the ferroelectric material and the paraelectric material may exhibit the characteristics of the paraelectric material.

Alternatively, when an average value of a maximum value $C_{max}$ and a minimum value $C_{min}$ of the capacitance of the ferroelectric material is smaller than the capacitance of the paraelectric material, the stacked film of the ferroelectric material and the paraelectric material may exhibit the characteristics of the paraelectric material.

Figure 5:
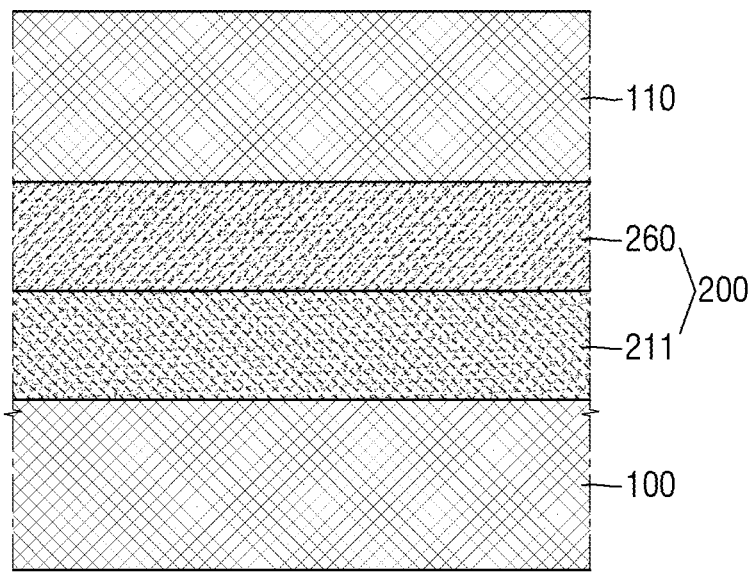
FIGS. 5 to 12 are diagrams illustrating the semiconductor device according to some embodiments, respectively.

FIG. 5 is a diagram illustrating a semiconductor device according to some embodiments. For convenience of explanation, differences from those described using FIG. 2a will be mainly described.

Referring to FIG. 5, in the semiconductor device according to some embodiments, the first capacitor dielectric film 200 may include a second ferroelectric film 211 and a first paraelectric film 260.

The second ferroelectric film 211 may include a ferroelectric material. The second ferroelectric film 211 may include a second bimetal oxide. The second ferroelectric film 211 may include a metal oxide film, for example, a second bimetal oxide film.

The metal contained in the second bimetal oxide may be contained in the transition metal of group 4 (IV B) of the periodic table. The metals contained in the second bimetal oxide film may be, for example, hafnium (Hf) and zirconium (Zr). The second bimetal oxide film may be a hafnium zirconium oxide film ($Hf_xZr_{(1-x)}O$). In the second bimetal oxide film, x may be 0.4 or more and 0.6 or less. In some embodiments, the hafnium zirconium oxide film ($Hf_xZr_{(1-x)}O$) may have a chemical formula suitable for the stoichiometry, or may have a chemical formula not suitable for the stoichiometry.

The second ferroelectric film 211 may have an orthorhombic crystal system. The second ferroelectric film 211 may be a second bimetal oxide film having an orthorhombic crystal system.

As an example, the second ferroelectric film 211 may further include a dopant doped in the second bimetal oxide film. The dopant may include at least one of gadolinium (Gd), silicon (Si), aluminum (Al), yttrium (Y), lanthanum (La), scandium (Sc), cerium (Ce), dysprosium (Dy), tantalum (Ta), and strontium (Sr).

As another example, the second bimetal oxide film may not contain a dopant doped in the film.

In the semiconductor device according to some embodiments of the present inventive concepts, the second ferroelectric film 211 may be a single film including or consisting of a second bimetal oxide film. When the second ferroelectric film 211 is a second monometal oxide film which is a single film, in a thickness range of the hafnium zirconium oxide film from 5 nm or more to 20 nm or less, the hafnium zirconium oxide film may have ferroelectric characteristics.

Figure 6:
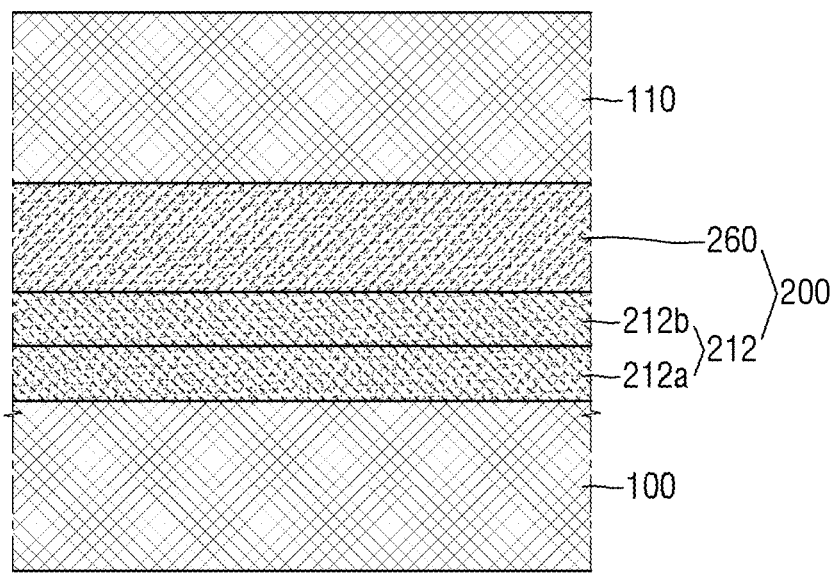

FIG. 6 is a diagram illustrating the semiconductor device according to some embodiments. For convenience of explanation, differences from those described using FIG. 2a will be mainly described.

Referring to FIG. 6, in the semiconductor device according to some embodiments, the first capacitor dielectric film 200 may include a third ferroelectric film 212 and a first paraelectric film 260.

The third ferroelectric film 212 may include a first sub-dielectric film 212a and a second sub-dielectric film 212b sequentially stacked between the first electrode 100 and the first paraelectric film 260. The second sub-dielectric film 212b may be disposed between the first sub-dielectric film 212a and the first paraelectric film 260. The stacked first sub-dielectric film 212a and second sub-dielectric film 212b have ferroelectric characteristics.

The first sub-dielectric film 212a may include a third monometal oxide film. The metal contained in the third monometal oxide film may be zirconium (Zr). The third monometal oxide film may be a zirconium oxide film (ZrO).

The second sub-dielectric film 212b may include a fourth monometal oxide film. The metal contained in the fourth monometal oxide film may be hafnium (Hf). The fourth monometal oxide film may be a hafnium oxide film (HfO).

The first sub-dielectric film 212a is a single film including or consisting of a third metal oxide film, and the second sub-dielectric film 212b may be a single film including or consisting of a fourth monometal oxide film. That is, the third ferroelectric film 212 may be a stacked film of the third monometal oxide film and the fourth monometal oxide film which are single films different from each other.

The third ferroelectric film 212 may be a stacked film in which a zirconium oxide film (ZrO) and a hafnium oxide film (HfO), each of which is a single film, are stacked.

In the third ferroelectric film 212, a ratio (Hf/Hf(Hf+Zr)) of hafnium (Hf) to the total of hafnium (Hf) and zirconium (Zr) may be greater than or equal to 0.35 or and smaller than 1. The thickness of the third ferroelectric film 212 may be 1 nm or more and 20 nm or less. The third ferroelectric film 212 may further include a dopant doped in the film.

The third ferroelectric film 212 may have an orthorhombic crystal system. The third ferroelectric film 212 may be a stacked film of the third monometal oxide film and the fourth monometal oxide film having an orthorhombic crystal system. Each of the third monometal oxide film and the fourth monometal oxide film may have the orthorhombic crystal system.

Figure 7:
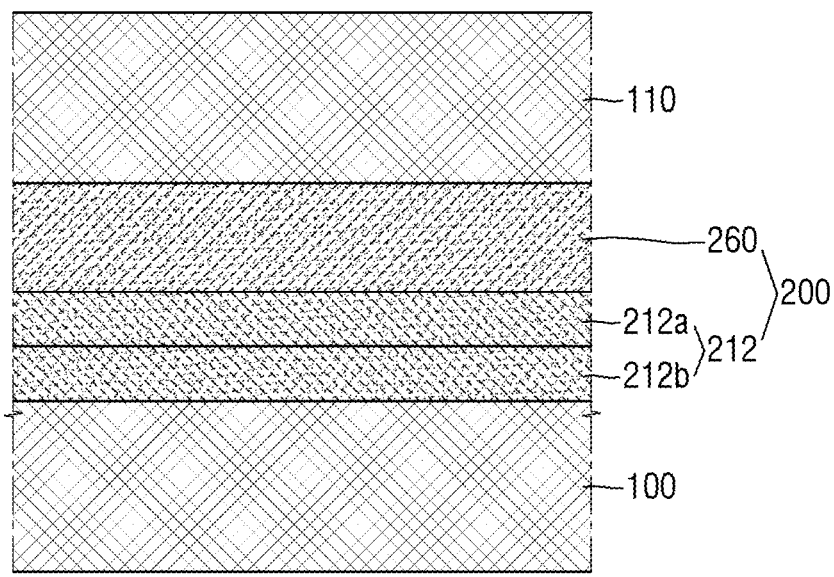

FIG. 7 is a diagram illustrating the semiconductor device according to some embodiments. For convenience of explanation, differences from those described using FIG. 6 will be mainly described.

Referring to FIG. 7, in the semiconductor device according to some embodiments, the first sub-dielectric film 212a may be disposed between the second sub-dielectric film 212b and the first paraelectric film 260. The second sub-dielectric film 212b and the first sub-dielectric film 212a are sequentially stacked between the first electrode 100 and the first paraelectric film 260.

The third ferroelectric film 212 may be a stacked film in which a hafnium oxide film (HfO) and a zirconium oxide film (ZrO), each of which is a single film, are stacked.

When the first paraelectric film 260 includes the zirconium oxide film (ZrO) which is a monometal oxide film, the first paraelectric film 260 may have one crystal system, among a monoclinic crystal system, a tetragonal crystal system and a cubic crystal system.

Figure 8:
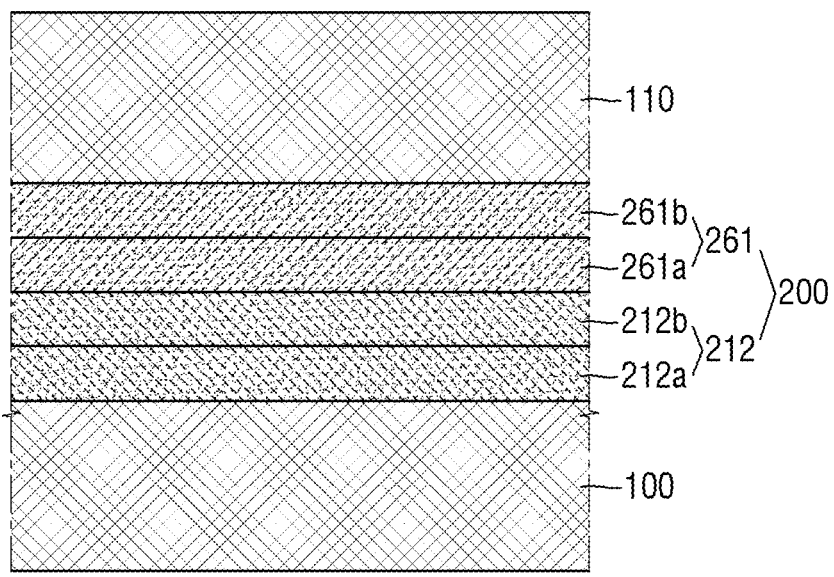

FIG. 8 is a diagram illustrating the semiconductor device according to some embodiments. For convenience of explanation, differences from those described using FIG. 6 will be mainly described.

Referring to FIG. 8, in the semiconductor device according to some embodiments, the first capacitor dielectric film 200 may include a third ferroelectric film 212 and a second paraelectric film 261.

The second paraelectric film 261 may include a third sub-dielectric film 261a and a fourth sub-dielectric film 261a sequentially stacked between the third ferroelectric film 212 and the second electrode 110. The third sub-dielectric film 261a may be disposed between the fourth sub-dielectric film 261b and the third ferroelectric film 212. The stacked third sub-dielectric film 261a and fourth sub-dielectric film 261b may have the paraelectric characteristics.

The third sub-dielectric film 261a may include a fifth monometal oxide film. The metal contained in the fifth monometal oxide film may be zirconium (Zr). The fifth monometal oxide film may be a zirconium oxide film (ZrO).

The fourth sub-dielectric film 261b may include a sixth monometal oxide film. The metal contained in the sixth monometal oxide film may be hafnium (Hf). The sixth monometal oxide film may be a hafnium oxide film (HfO).

The third sub-dielectric film 261a may be a single film including or consisting of the fifth metal oxide film, and the fourth sub-dielectric film 261b may be a single film including or consisting of the sixth monometal oxide film. That is, the second paraelectric film 261 may be a stacked film of the fifth monometal oxide film and the sixth monometal oxide film which are single films different from each other.

The second paraelectric film 261 may be a stacked film in which a zirconium oxide film (ZrO) and a hafnium oxide film (HfO), each of which is a single film, are stacked.

In the second paraelectric film 261, the ratio (Hf/Hf(Hf+Zr)) of hafnium (Hf) to the total of hafnium (Hf) and zirconium (Zr) may be smaller than 0.35 and greater than 0.

The second paraelectric film 261 may have one crystal system, among the monoclinic crystal system, the tetragonal crystal system, and the cubic crystal system. Each of the fifth monometal oxide film and the sixth monometal oxide film may have one crystal system, among the monoclinic crystal system, the tetragonal crystal system, and the cubic crystal system.

Unlike the case illustrated in FIG. 8, the second sub-dielectric film 212b may be disposed between the first sub-dielectric film 212a and the first electrode 100.

In addition, unlike the case illustrated in FIG. 8, the third sub-dielectric film 261a may be disposed between the fourth sub-dielectric film 261b and the second electrode 110.

Figure 9:
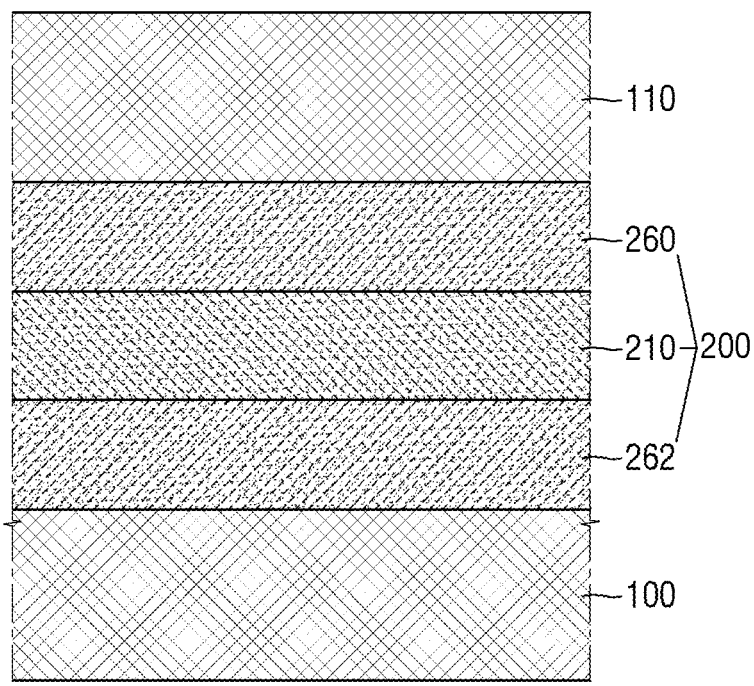

FIG. 9 is a diagram illustrating the semiconductor device according to some embodiments. For convenience of explanation, differences from those described using FIG. 2a will be mainly described.

Referring to FIG. 9, the semiconductor device according to some embodiments may further include a third paraelectric film 262.

The third paraelectric film 262 may be disposed between the first ferroelectric film 210 and the first electrode 100. The first ferroelectric film 210 may be disposed between the third paraelectric film 262 and the first paraelectric film 260.

The third paraelectric film 262 may be a single film or a stacked film in which single films different from each other are stacked.

As an example, when the third paraelectric film 262 is a single film, the third paraelectric film 262 may include a second monometal oxide film or a first bimetal oxide film. The description of the second monometal oxide film and the first bimetal oxide film may be substantially the same as the description of the first paraelectric film 260 of FIG. 2a.

As another example, the third paraelectric film 262 may be a stacked film in which single films different from each other are stacked. The third paraelectric film 262 may be a stacked film of the fifth monometal oxide film and the sixth monometal oxide film which are single films different from each other. The description of the fifth monometal oxide film and the sixth monometal oxide film may be substantially the same as the description of the second paraelectric film 261 of FIG. 8.

The third paraelectric film 262 may include a metal oxide film having the same chemical formula as the first paraelectric film 260, and may also include a metal oxide film having different chemical formula. When the third paraelectric film 262 and the first paraelectric film 260 include metal oxide films having the same chemical formula, the crystal system of the third paraelectric film 262 may be the same as or different from the crystal system of the first paraelectric film 260.

Unlike the case illustrated in FIG. 9, the first ferroelectric film 210 may be replaced with the second ferroelectric film 211 of FIG. 5. Also, the first ferroelectric film 210 may be replaced with the third ferroelectric film 212 of FIGS. 6 and 7.

In addition, the first paraelectric film 260 may be replaced with the second paraelectric film 261 of FIG. 8.

Figure 10:
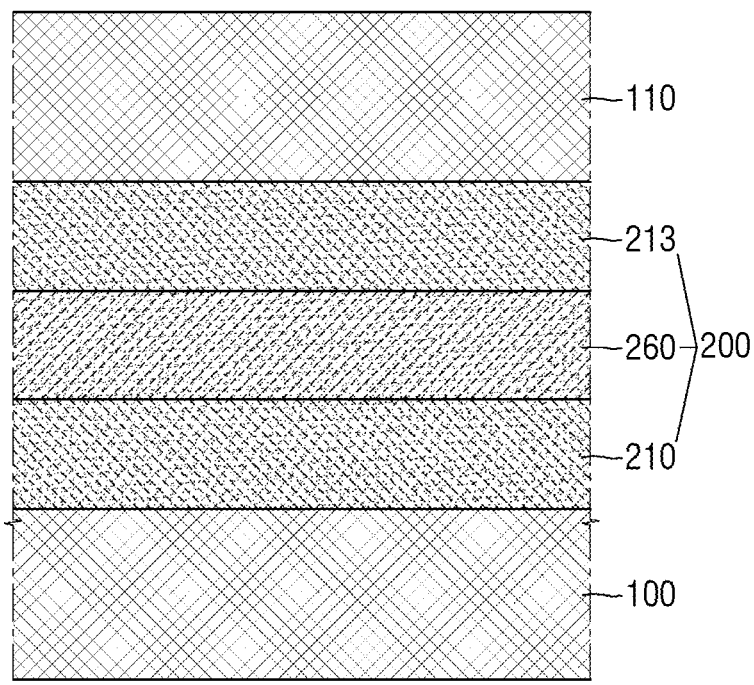

FIG. 10 is a diagram illustrating the semiconductor device according to some embodiments. For convenience of explanation, differences from those described using FIG. 2a will be mainly described.

Referring to FIG. 10, the semiconductor device according to some embodiments may further include a fourth ferroelectric film 213.

The fourth ferroelectric film 213 may be disposed between the first paraelectric film 260 and the second electrode 110. The first paraelectric film 260 may be disposed between the first ferroelectric film 210 and the fourth ferroelectric film 213.

The fourth ferroelectric film 213 may be a single film or a stacked film in which single films different from each other are stacked.

As an example, when the fourth ferroelectric film 213 is a single film, the fourth ferroelectric film 213 may include a first monometal oxide film or a second bimetal oxide film. The description of the first monometal oxide film may be substantially the same as the description of the first ferroelectric film 210 of FIG. 2a. The description of the second bimetal oxide film may be substantially the same as the description of the second ferroelectric film 211 of FIG. 5.

As another example, the fourth ferroelectric film 213 may be a stacked film in which single films different from each other are stacked. The fourth ferroelectric film 213 may be a stacked film of the third monometal oxide film and the fourth monometal oxide film which are single films different from each other. The description of the third monometal oxide film and the fourth monometal oxide film may be substantially the same as the description of the third ferroelectric film 212 of FIGS. 6 and 7.

Unlike the case illustrated in FIG. 10, the first ferroelectric film 210 may be replaced with the second ferroelectric film 211 of FIG. 5. Also, the first ferroelectric film 210 may be replaced with the third ferroelectric film 212 of FIGS. 6 and 7.

In addition, the first paraelectric film 260 may be replaced with the second paraelectric film 261 of FIG. 8.

Figure 11:
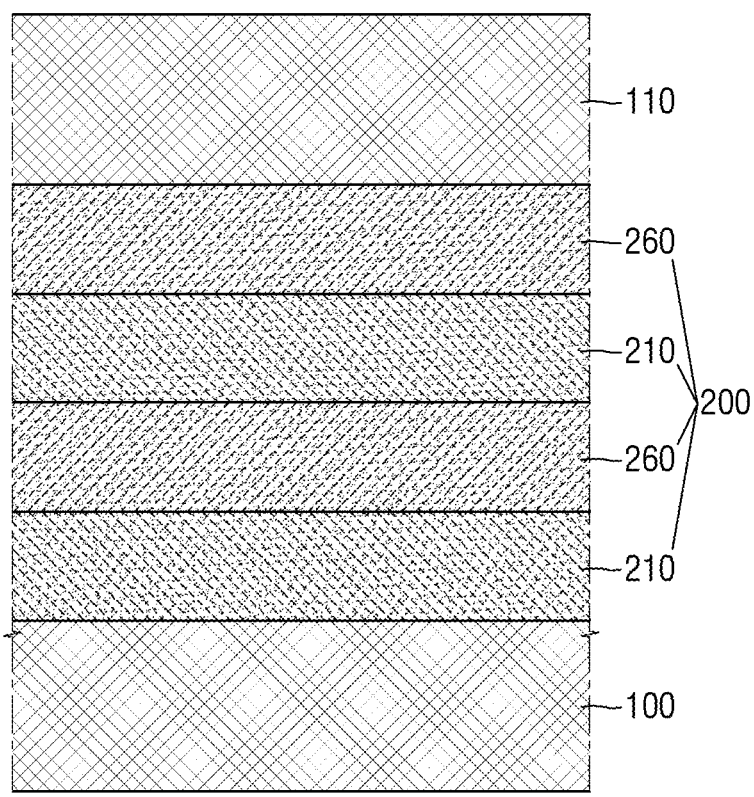

FIG. 11 is a diagram illustrating the semiconductor device according to some embodiments. For convenience of explanation, differences from those described using FIG. 2a will be mainly described.

Referring to FIG. 11, in the semiconductor device according to some embodiments, the first capacitor dielectric film 200 may include a plurality of first ferroelectric films 210 and a plurality of first paraelectric films 260.

The first ferroelectric film 210 and the first paraelectric film 260 may form a dielectric film group. The first capacitor dielectric film 200 may include a plurality of dielectric film groups.

The first capacitor dielectric film 200 may include the first ferroelectric film 210 and the first paraelectric film 260 which are alternately stacked. Although FIG. 11 illustrates that the first capacitor dielectric film 200 includes two dielectric film groups, this is only for convenience of description, and the embodiments are not limited thereto.

Unlike the case illustrated in FIG. 11, the first ferroelectric film 210 may be replaced with the second ferroelectric film 211 of FIG. 5. Also, the first ferroelectric film 210 may be replaced with the third ferroelectric film 212 of FIGS. 6 and 7.

In addition, the first paraelectric film 260 may be replaced with the second paraelectric film 261 of FIG. 8.

Figure 12:
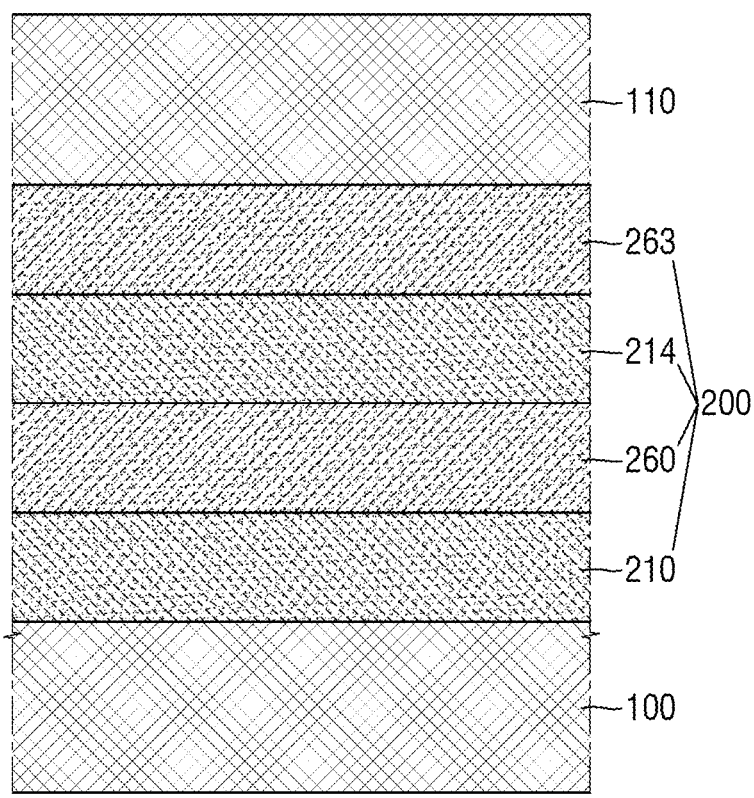

FIG. 12 is a diagram illustrating the semiconductor device according to some embodiments. For convenience of explanation, differences from those described using FIG. 2a will be mainly described.

Referring to FIG. 12, in the semiconductor device according to some embodiments, the first capacitor dielectric film 200 may further include a fifth ferroelectric film 214 and a fourth paraelectric film 263.

The fifth ferroelectric film 214 and the fourth paraelectric film 263 may be disposed between the first paraelectric film 260 and the second electrode 110. The fifth ferroelectric film 214 may be disposed between the first paraelectric film 260 and the fourth paraelectric film 263. The fourth paraelectric film 263 may be disposed between the fifth ferroelectric film 214 and the second electrode 110.

The first capacitor dielectric film 200 may include the ferroelectric material film and the paraelectric material film alternately stacked, between the first electrode 100 and the second electrode 110.

The fifth ferroelectric film 214 may be a single film or a stacked film in which single films different from each other are stacked.

As an example, when the fifth ferroelectric film 214 is a single film, the fifth ferroelectric film 214 may include the first monometal oxide film or the second bimetal oxide film. The description of the first monometal oxide film may be substantially the same as the description of the first ferroelectric film 210 of FIG. 2a. The description of the second bimetal oxide film may be substantially the same as the description of the second ferroelectric film 211 of FIG. 5.

As another example, the fifth ferroelectric film 214 may be a stacked film in which single films different from each other are stacked. The fifth ferroelectric film 214 may be a stacked film of the third monometal oxide film and the fourth monometal oxide film which are single films different from each other. The description of the third monometal oxide film and the fourth monometal oxide film may be substantially the same as the description of the third ferroelectric film 212 of FIGS. 6 and 7.

The fourth paraelectric film 263 may be a single film or a stacked film in which single films different from each other are stacked.

As an example, when the fourth paraelectric film 263 is a single film, the fourth paraelectric film 263 may include a second monometal oxide film or a first bimetal oxide film. The description of the second monometal oxide film and the first bimetal oxide film may be substantially the same as the description of the first paraelectric film 260 of FIG. 2a.

As another example, the fourth paraelectric film 263 may be a stacked film in which single films different from each other are stacked. The fourth paraelectric film 263 may be a stacked film of the fifth monometal oxide film and the sixth monometal oxide film which are single films different from each other. The description of the fifth monometal oxide film and the sixth monometal oxide film may be substantially the same as the description of the second paraelectric film 261 of FIG. 8.

Each of the first ferroelectric film 210 and the fifth ferroelectric film 214 is a dielectric film having ferroelectric characteristics. However, as an example, the first ferroelectric film 210 and the fifth ferroelectric film 214 may have film structures different from each other, i.e., the structures of the single film and the stacked film. As another example, the first ferroelectric film 210 and the fifth ferroelectric film 214 may include metal oxide films having chemical formulas different from each other.

The first paraelectric film 260 and the fourth paraelectric film 263 are dielectric films having the paraelectric characteristics, respectively. However, as an example, the first paraelectric film 260 and the fourth paraelectric film 263 may have film structures different from each other, i.e., the structures of the single film and the stacked film. As another example, the first paraelectric film 260 and the fourth paraelectric film 263 may include the metal oxide films having chemical formulas different from each other. As another example, the first paraelectric film 260 and the fourth paraelectric film 263 may have the crystal systems different from each other.

Figure 13:
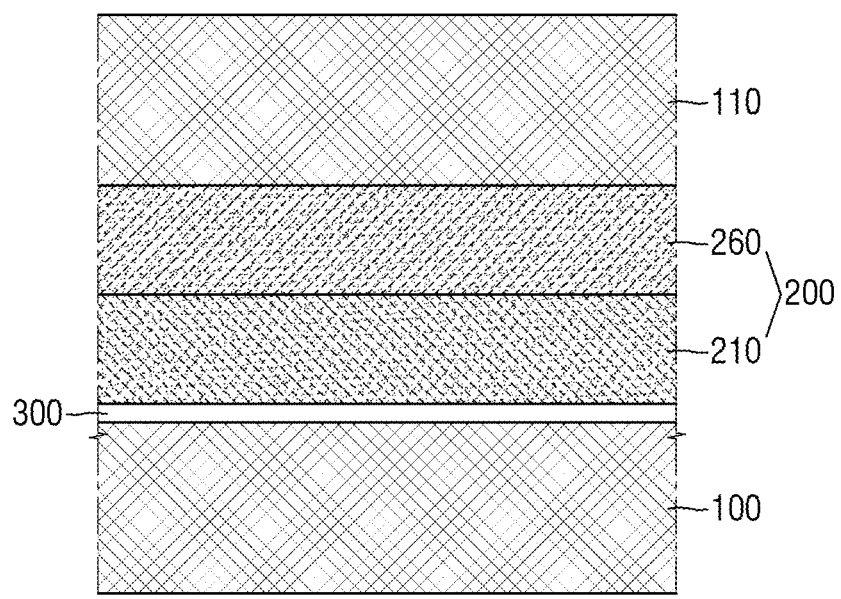
FIGS. 13 to 15 are diagrams illustrating the semiconductor device according to some embodiments, respectively.
Figure 14:
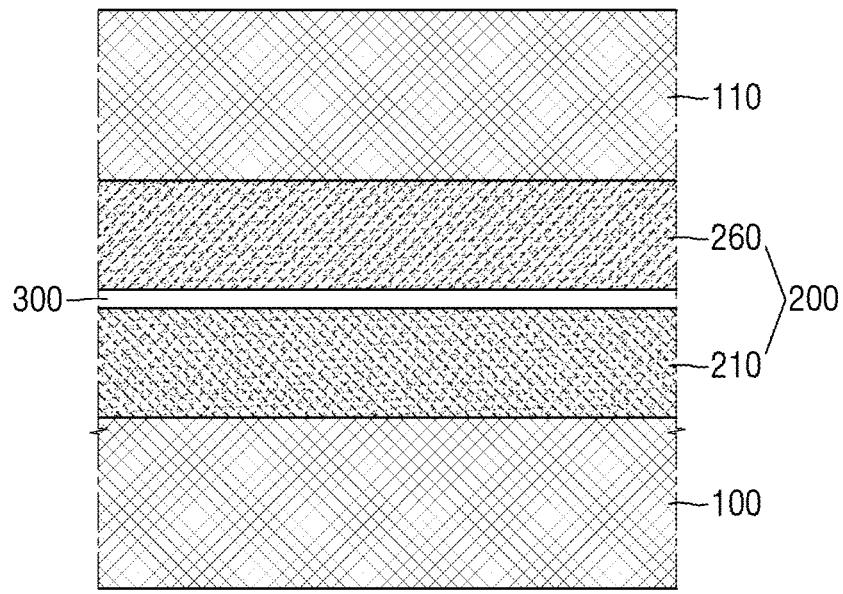
Figure 15:
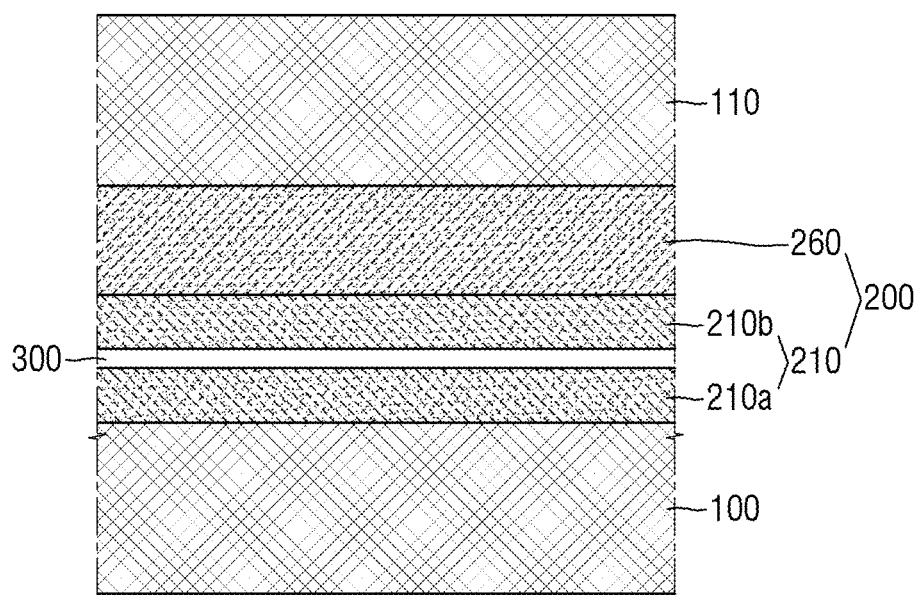

FIGS. 13 to 15 are diagrams illustrating the semiconductor device according to some embodiments, respectively. For convenience of explanation, differences from those described using FIG. 2a will be mainly described.

Referring to FIGS. 13 to 15, the semiconductor device according to some embodiments may further include an interfacial film 300 disposed between the first electrode 100 and the second electrode 110.

The interfacial film 300 may be in contact with the first ferroelectric film 210. The interfacial film 300 may include a conductive material. For example, the thickness of the interfacial film 300 may be smaller than or equal to 1 nm. The interfacial film 300 may promote formation of the first ferroelectric film 210 as an orthorhombic crystal system.

The interfacial film 300 may include, for example, at least one of nitride or oxide of cobalt (Co), titanium (Ti), tantalum (Ta), niobium (Nb), molybdenum (Mo), and tin (Sn). Alternatively, the interfacial film 300 may include at least one of ruthenium (Ru) or ruthenium oxide.

In FIG. 13, the interfacial film 300 may be disposed between the first electrode 100 and the first ferroelectric film 210. The interfacial film 300 may be in contact with the first ferroelectric film 210.

In FIG. 14, the interfacial film 300 may be disposed between the first ferroelectric film 210 and the first paraelectric film 260. The interfacial film 300 may be in contact with the first ferroelectric film 210.

In FIG. 15, the interfacial film 300 may be disposed in the first ferroelectric film 210. The first ferroelectric film 210 may be divided into a first portion 210a of the first ferroelectric film and a second portion 210b of the first ferroelectric film, by the interfacial film 300. The interfacial film 300 may be in contact with the first portion 210a of the first ferroelectric film and the second portion 210b of the first ferroelectric film.

In FIGS. 13 to 15, although there is a single interfacial film 300 being in contact with the first ferroelectric film 210, the embodiments are not limited thereto. That is, the interfacial film 300 being in contact with the first ferroelectric film 210 may be disposed at a plurality of positions, and at least one or more interfacial films 300 may be included.

Figure 16:
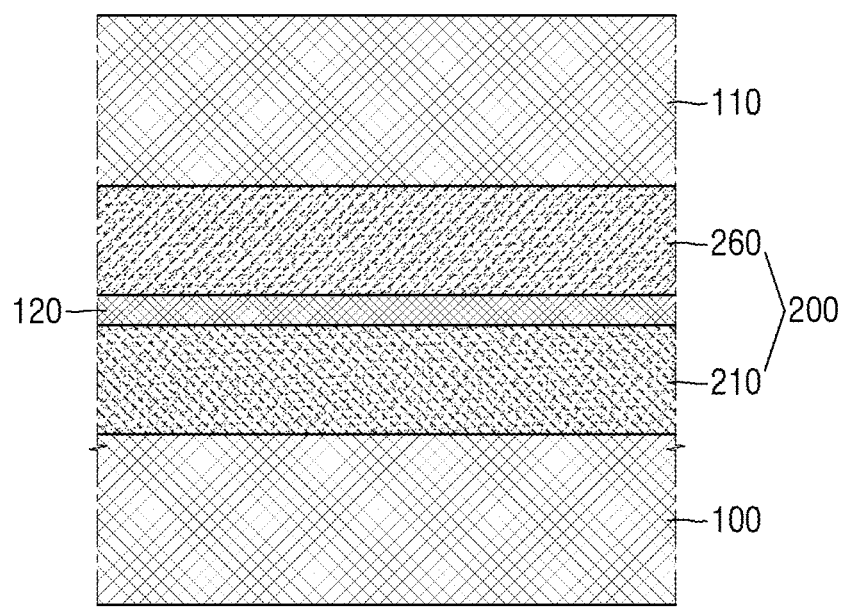
FIG. 16 is a diagram illustrating the semiconductor device according to some embodiments.

FIG. 16 is a diagram illustrating the semiconductor device according to some embodiments. For convenience of explanation, differences from those described in FIG. 2a will be mainly described.

Referring to FIG. 16, the semiconductor device according to some embodiments may further include a third electrode 120.

The third electrode 120 may be disposed between the first electrode 100 and the second electrode 110. More specifically, the third electrode 120 may be disposed between the first ferroelectric film 210 and the first paraelectric film 260.

The third electrode 120 may include, for example, but is not limited to, a doped semiconductor material, a conductive metal nitride (e.g., titanium nitride, tantalum nitride, niobium nitride or tungsten nitride), a metal (e.g., ruthenium, iridium, titanium or tantalum), and conductive metal oxides (e.g., iridium oxide or niobium oxide).

Figure 17:
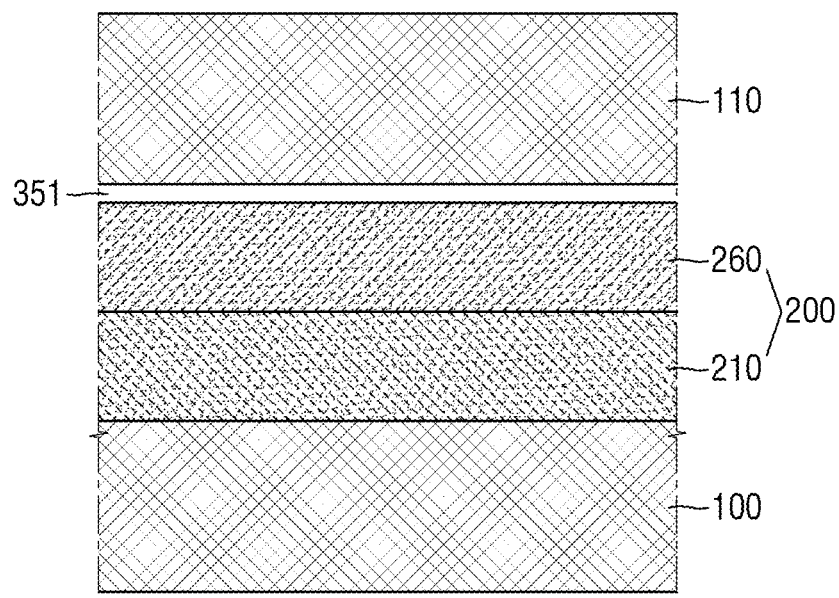
FIGS. 17 and 18 are diagrams illustrating the semiconductor device according to some embodiments.
Figure 18:
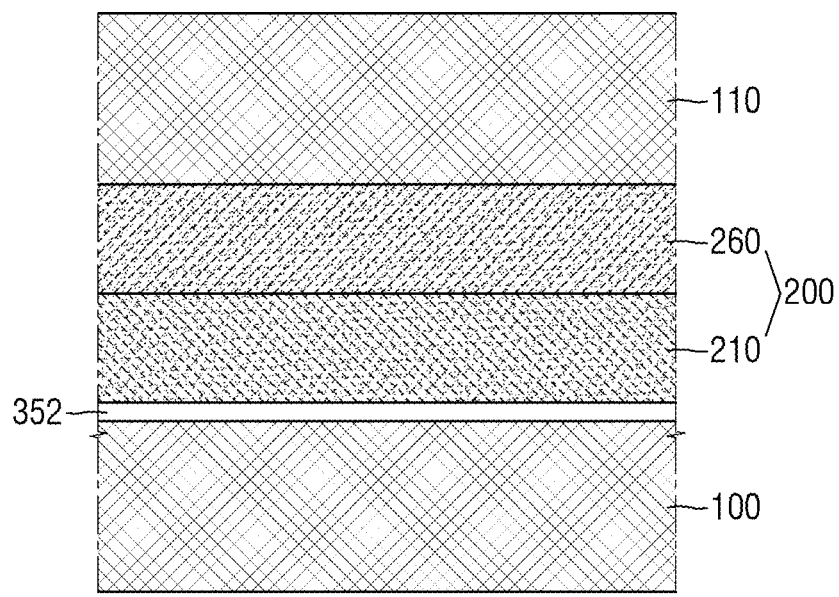

FIGS. 17 and 18 are diagrams illustrating the semiconductor device according to some embodiments. For convenience of explanation, differences from those described using FIG. 2a will be mainly described.

Referring to FIG. 17, the semiconductor device according to some embodiments may further include a paraelectric protection layer 351.

The paraelectric protection layer 351 may be disposed between the first electrode 100 and the second electrode 110. The paraelectric protection layer 351 may be disposed between the second electrode 110 and the first capacitor dielectric film 200.

For example, the paraelectric protection layer 351 may be disposed between the second electrode 110 and the first paraelectric film 260. The paraelectric protection layer 351 may reduce or prevent the oxygen atoms contained in the first paraelectric film 260 from moving to the second electrode 110.

The paraelectric protection layer 351 may include metal oxide or metal nitride. The paraelectric protection layer 351 may include, for example, at least one of titanium oxide, tantalum oxide, molybdenum oxide, tin oxide, niobium nitride, and niobium oxide. The thickness of the paraelectric film protection layer 351 may be, for example, 0.5 nm or more and 1 nm or less.

Referring to FIG. 18, the semiconductor device according to some embodiments may further include a ferroelectric protection layer 352.

The ferroelectric protection layer 352 may be disposed between the first electrode 100 and the second electrode 110. The ferroelectric protection layer 352 may be disposed between the first electrode 100 and the first capacitor dielectric film 200.

For example, the ferroelectric protection layer 352 may be disposed between the first electrode 100 and the first ferroelectric film 210. The ferroelectric protection layer 352 may reduce or prevent oxygen atoms contained in the first ferroelectric film 210 from moving to the first electrode 100.

The ferroelectric protection layer 352 may include metal oxide or metal nitride. The ferroelectric protection layer 352 may include, for example, at least one of titanium oxide, tantalum oxide, molybdenum oxide, tin oxide, niobium nitride, and niobium oxide. The thickness of the ferroelectric protection layer 352 may be, for example, 0.5 nm or more and 1 nm or less.

Unlike the case illustrated in FIGS. 17 and 18, the semiconductor device according to some embodiments may, of course, include both the paraelectric protection layer 351 and the ferroelectric protection layer 352.

Figure 19:
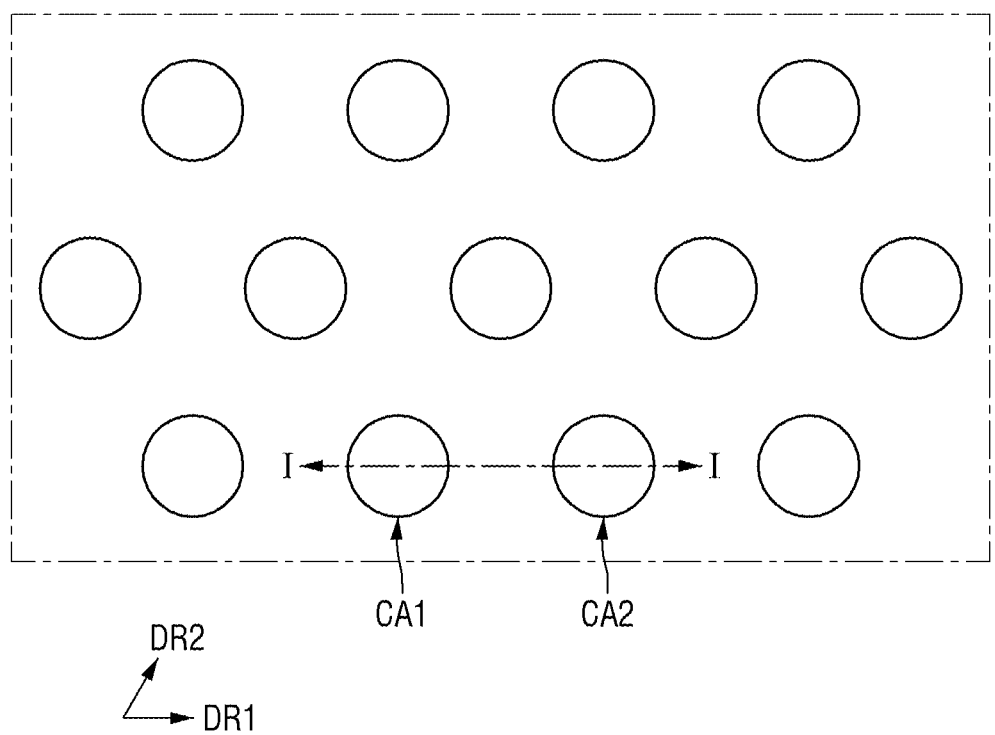
FIG. 19 is a layout diagram schematically illustrating an arrangement of cell capacitors of the semiconductor device according to some embodiments.
Figure 20:
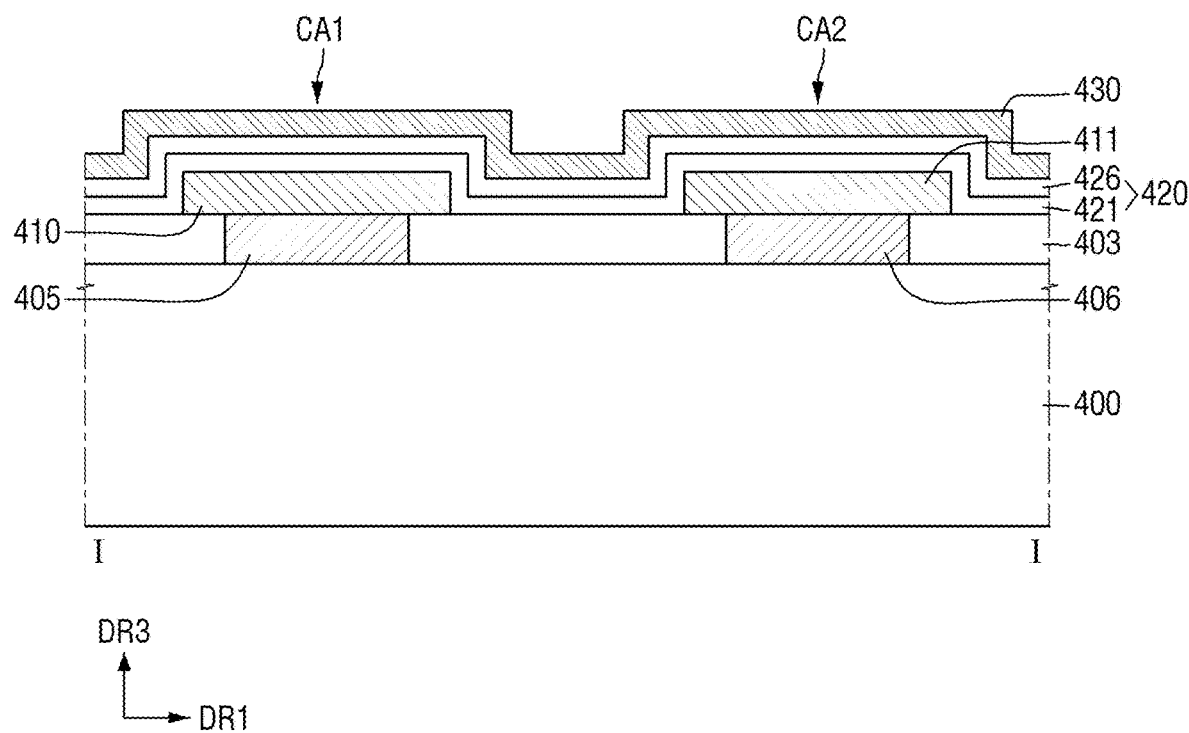
FIG. 20 is a cross-sectional view taken along a line I-I of FIG. 19.

FIG. 19 is a layout diagram schematically illustrating an arrangement of cell capacitors of the semiconductor device according to some embodiments. FIG. 20 is a cross-sectional view taken along a line I-I of FIG. 19.

Referring to FIG. 19, the semiconductor device according to some embodiments may include a plurality of cell capacitors arranged along a first direction DR1 and a second direction DR2.

Each cell capacitor may correspond to the capacitor CA of FIG. 1. The plurality of cell capacitors may include a first cell capacitor CA1 and a second cell capacitor CA2 adjacent to each other.

Although FIG. 19 illustrates that the first direction DR1 and the second direction DR2 are not directions orthogonal to each other, the present inventive concepts are not limited thereto.

In FIG. 19, each cell capacitor is illustrated to be circular from the viewpoint of the plan view, but the embodiments are not limited thereto.

Referring to FIGS. 19 and 20, the semiconductor device according to some embodiments may include a first lower electrode 410, a second lower electrode 411, a second capacitor dielectric film 420, and/or an upper electrode 430.

The first cell capacitor CA1 includes a first lower electrode 410, a second capacitor dielectric film 420, and/or an upper electrode 430, and the second cell capacitor CA2 may include a second lower electrode 411, a second capacitor dielectric film 420 and/or an upper electrode 430.

For example, the first cell capacitor CA1 and the second cell capacitor CA2 may be divided by the first lower electrode 410 and the second lower electrode 411. The second capacitor dielectric film 420 and the upper electrode 430 may be shared by the first cell capacitor CA1 and the second cell capacitor CA2.

The first lower electrode 410 and the second lower electrode 411 may be formed on the substrate 400. The substrate 400 may be bulk silicon or silicon-on-insulator (SOI). Unlike this, the substrate 400 may be a silicon substrate or may include other materials, for example, but is not limited to, silicon germanium, silicon germanium on insulator (SGOI), indium antimonide, lead tellurium compound, indium arsenide, indium phosphide, gallium arsenide or gallium antimonide.

On the substrate 400, for example, unit elements necessary for the operation of the semiconductor device, such as various types of active elements and passive elements, may be formed. The unit elements may be, for example, cell transistors such as a DRAM.

An interlayer insulating film 403 covering the unit elements may be formed on the substrate 400. First and second storage node contacts 405 and 406 for electrically connecting each of the unit elements to the first lower electrode 410 and the second lower electrode 411 may be formed in the interlayer insulating film 403. The first lower electrode 410 is electrically connected to the conductive regions included in the unit element by the first storage node contact 405, and the second lower electrode 411 may be electrically connected to the conductive regions included in the unit elements by the second storage node contact 406.

The interlayer insulating film 403 may include, for example, one of silicon oxide, silicon oxynitride, silicon nitride, and combinations thereof. The first and second storage node contacts 405 and 406 may include, for example, at least one of an impurity-doped semiconductor material, a conductive silicide compound, a conductive metal nitride, and a metal.

The first lower electrode 410 and the second lower electrode 411 may be formed on the interlayer insulating film 403. The first lower electrode 410 and the second lower electrode 411 may have a plate-like shape extending in parallel with the upper surface of the substrate 400.

The second capacitor dielectric film 420 may be formed on the first lower electrode 410 and the second lower electrode 411. The second capacitor dielectric film 420 may extend along the profiles of the first lower electrode 410 and the second lower electrode 411, and the upper surface of the interlayer insulating film 403.

The second capacitor dielectric film 420 may include a lower capacitor dielectric film 421 and an upper capacitor dielectric film 426 sequentially stacked in the third direction DR3.

The upper electrode 430 may be formed on the second capacitor dielectric film 420.

As an example, the first lower electrode 410 and the second lower electrode 411 correspond to the first electrode 100 described using FIGS. 1 to 18, and the upper electrode 430 may correspond to the second electrode 110 described using FIGS. 1 to 18.

The second capacitor dielectric film 420 may correspond to the first capacitor dielectric film 200 described using FIGS. 1 to 18. For example, the lower capacitor dielectric film 421 may correspond to first to third ferroelectric films (210, 211 and 212 of FIGS. 1 to 8) exhibiting the characteristics of the ferroelectric material. The upper capacitor dielectric film 426 may correspond to the first and second paraelectric films (260, and 261 of FIGS. 1 to 8) exhibiting the characteristics of the paraelectric material.

The lower capacitor dielectric film 421 may be substantially the same as the description of one of the first to third ferroelectric films (210, 211 and 212 of FIGS. 1 to 8). The description of the upper capacitor dielectric film 426 may be substantially the same as the description of one of the first and second paraelectric films (260 and 261 of FIGS. 1 to 8).

As another example, the first lower electrode 410 and the second lower electrode 411 may correspond to the second electrode 110 described using FIGS. 1 to 18, and the upper electrode 430 may correspond to the first electrode 100 described using FIGS. 1 to 18.

The second capacitor dielectric film 420 may correspond to the first capacitor dielectric film 200 described using FIGS. 1 to 18. For example, the lower capacitor dielectric film 421 may correspond to the first and second paraelectric films (260 and 261 of FIGS. 1 to 8) exhibiting the characteristics of the paraelectric material. The upper capacitor dielectric film 426 may correspond to the first to third ferroelectric films (210, 211 and 212 of FIGS. 1 to 8) exhibiting the characteristics of the ferroelectric material.

The lower capacitor dielectric film 421 may be substantially the same as the description of one of the first and second paraelectric films (260 and 261 of FIGS. 1 to 8). The upper capacitor dielectric film 426 may be substantially the same as the description of one of the first to third ferroelectric films (210, 211 and 212 of FIGS. 1 to 8).

In FIG. 20, the second capacitor dielectric film 420 is illustrated as including the lower capacitor dielectric film 421 and the upper capacitor dielectric film 426, but the embodiments are not limited thereto. Of course, the second capacitor dielectric film 420 may have the same structure as the first capacitor dielectric film of FIGS. 9 to 12.

In addition, the first cell capacitor CA1 and the second cell capacitor CA2 may further include the interfacial film 300 of FIGS. 13 to 15. Alternatively, the first cell capacitor CA1 and the second cell capacitor CA2 may include the third electrode 120 of FIG. 16. Alternatively, the first cell capacitor CA1 and the second cell capacitor CA2 may include the protection layers 351 and 352 of FIGS. 17 and 18.

Figure 21:
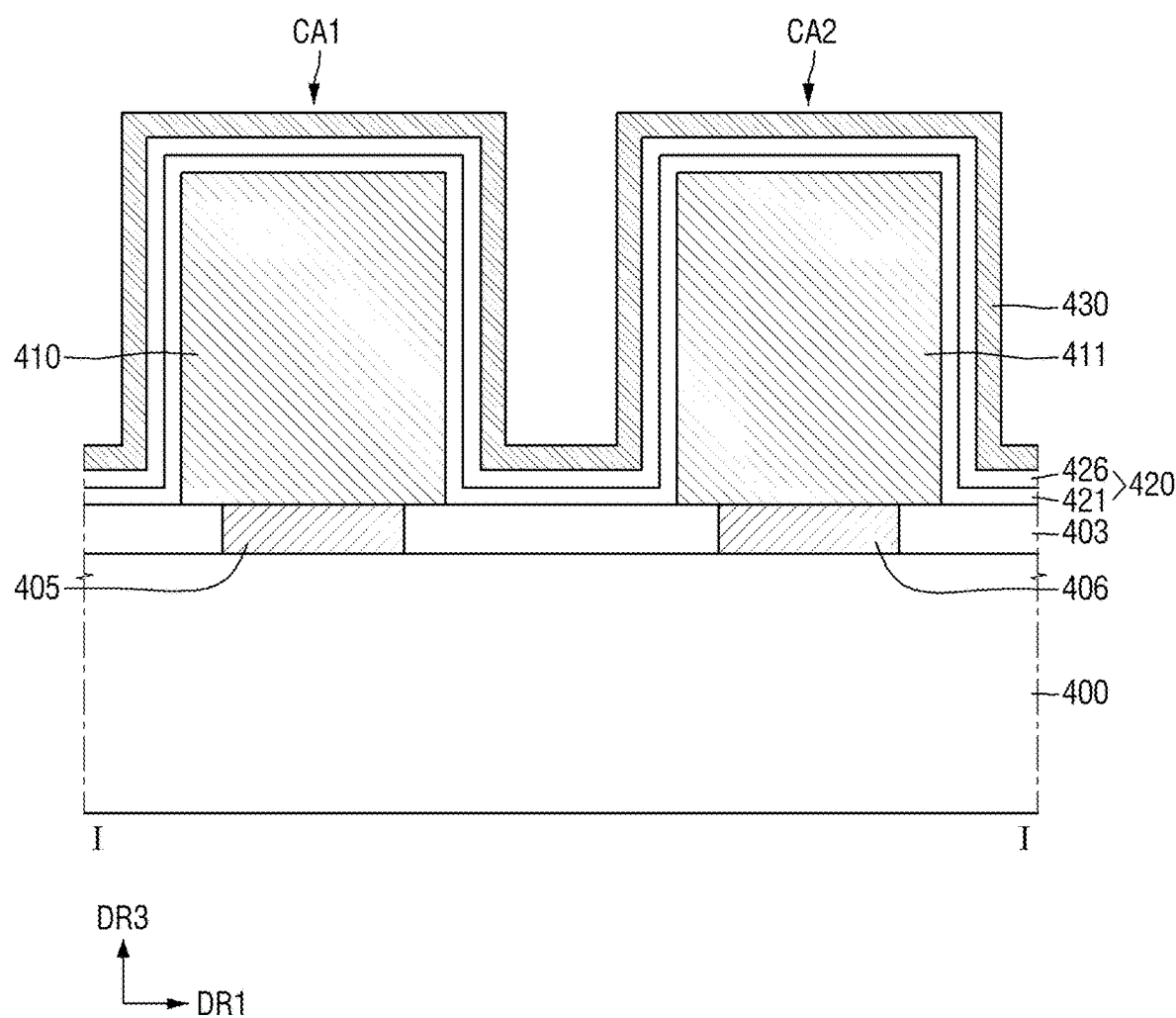
FIGS. 21 and 22 are diagrams illustrating the semiconductor device according to some embodiments.
Figure 22:
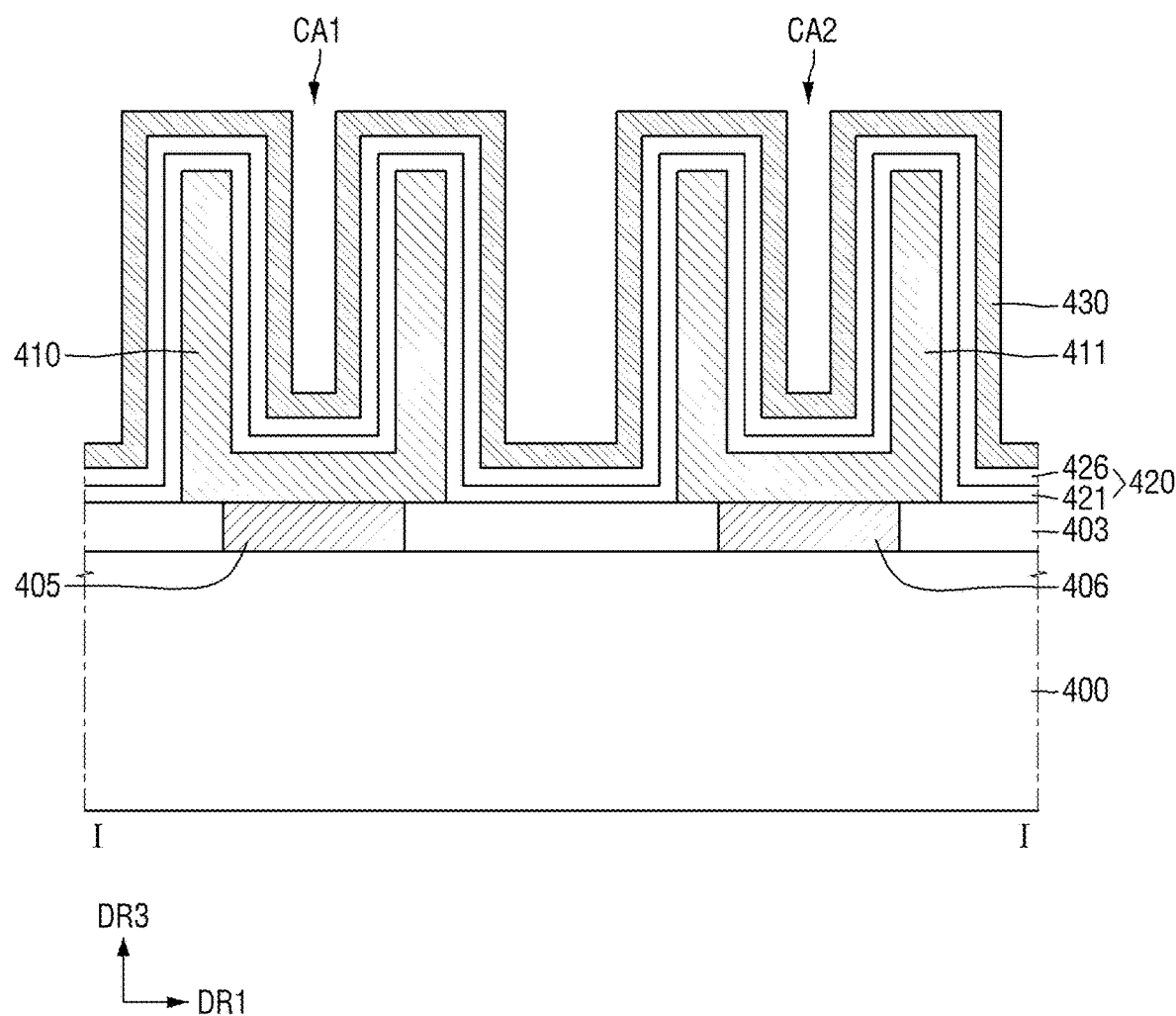

FIGS. 21 and 22 are diagrams illustrating the semiconductor device according to some embodiments. For convenience of explanation, differences from those described using FIGS. 19 and 20 will be mainly described. For reference, FIGS. 21 and 22 may be cross-sectional views taken along line I-I of FIG. 19, respectively.

Referring to FIG. 21, in the semiconductor device according to some embodiments, each of the first lower electrode 410 and the second lower electrode 411 may have a rod-like pillar shape extending long in the third direction DR3.

The second capacitor dielectric film 420 may be formed along an outer sidewall of the first lower electrode 410 and an outer sidewall of the second lower electrode 411.

Although not illustrated, an electrode support for connecting the first lower electrode 410 and the second lower electrode 411 may be further formed.

Referring to FIG. 22, in the semiconductor device according to some embodiments, each of the first lower electrode 410 and the second lower electrode 411 may have a cylinder shape.

Each of the first lower electrode 410 and the second lower electrode 411 may include a sidewall portion extending in the third direction DR3, and a bottom portion parallel to the upper surface of the substrate 400.

The second capacitor dielectric film 420 may extend along the profiles of the first lower electrode 410 and the second lower electrode 411. The second capacitor dielectric film 420 may extend along the inner sidewall and the outer sidewall of the sidewall portion of the first lower electrode 410, and the inner sidewall and the outer sidewall of the sidewall portion of the second lower electrode 411.

Although not illustrated, an electrode support for connecting the first lower electrode 410 and the second lower electrode 411 may be further formed.

Figure 23A:
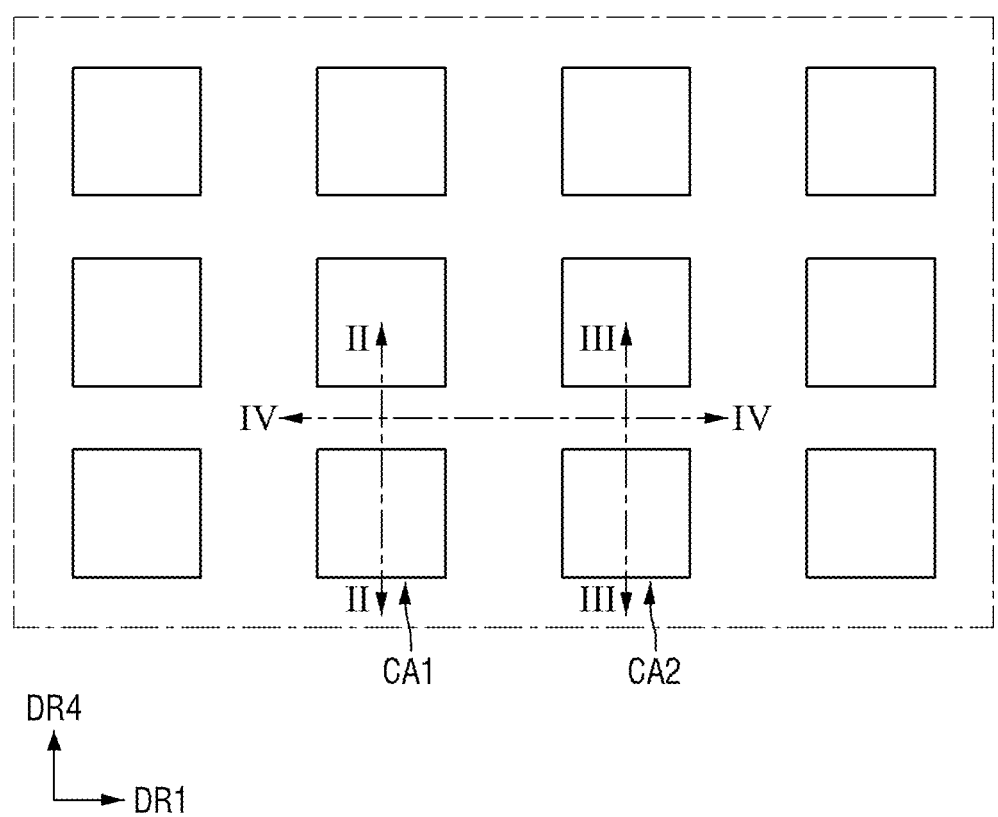
FIG. 23a is a layout diagram schematically illustrating an arrangement of cell capacitors of the semiconductor device according to some embodiments.
Figure 23B:
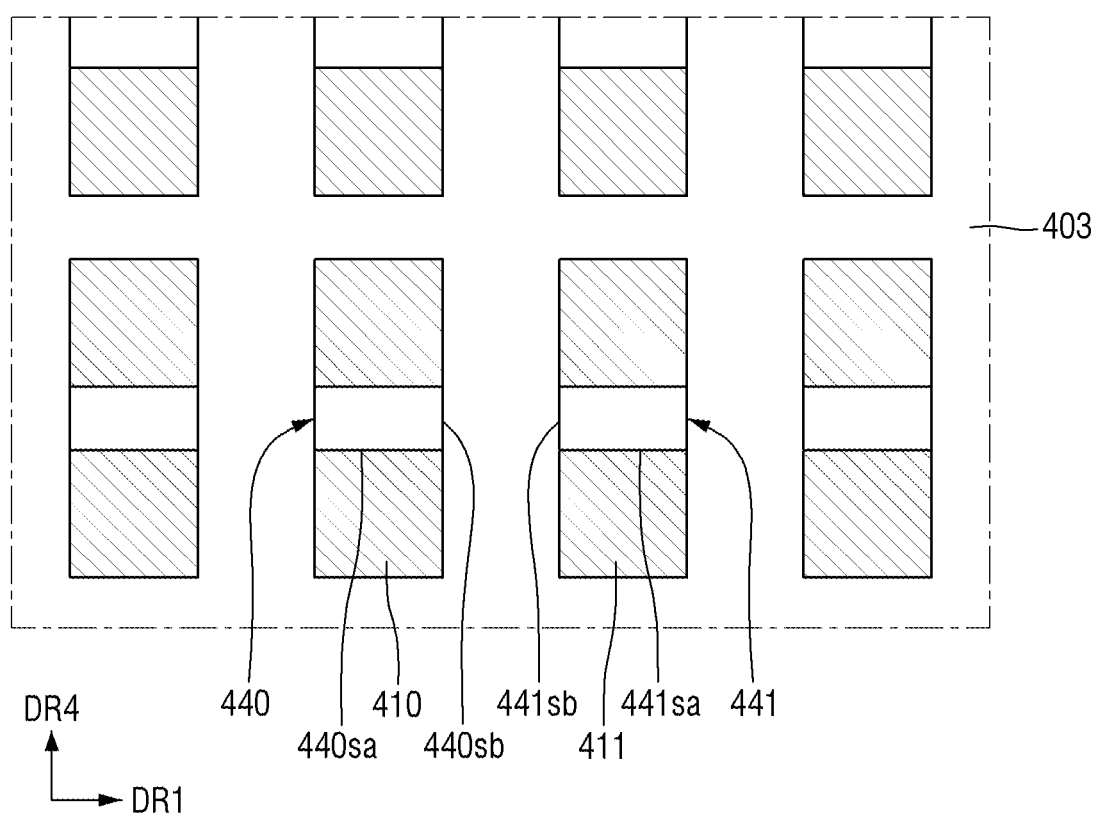
Figure 24:
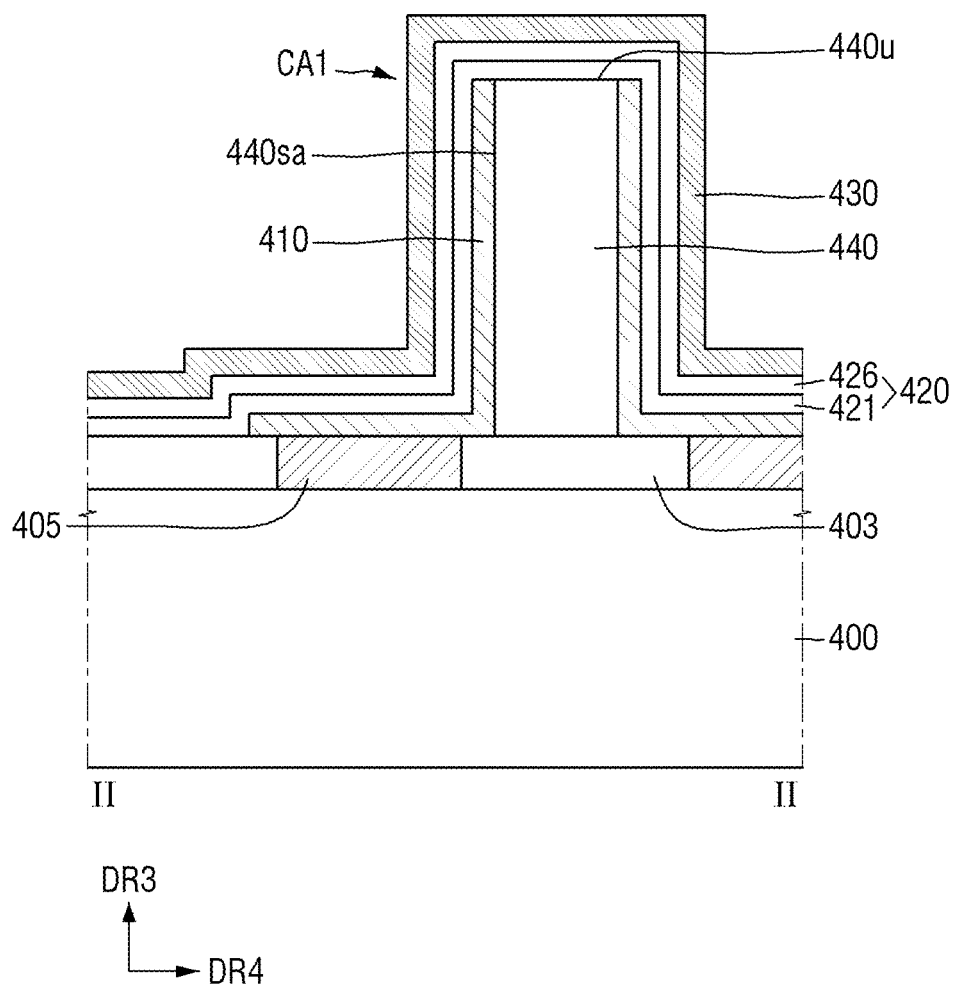
FIGS. 24 to 26 are cross-sectional views taken along the lines II-II, III-III and IV-IV of FIG. 23a, respectively.
Figure 25:
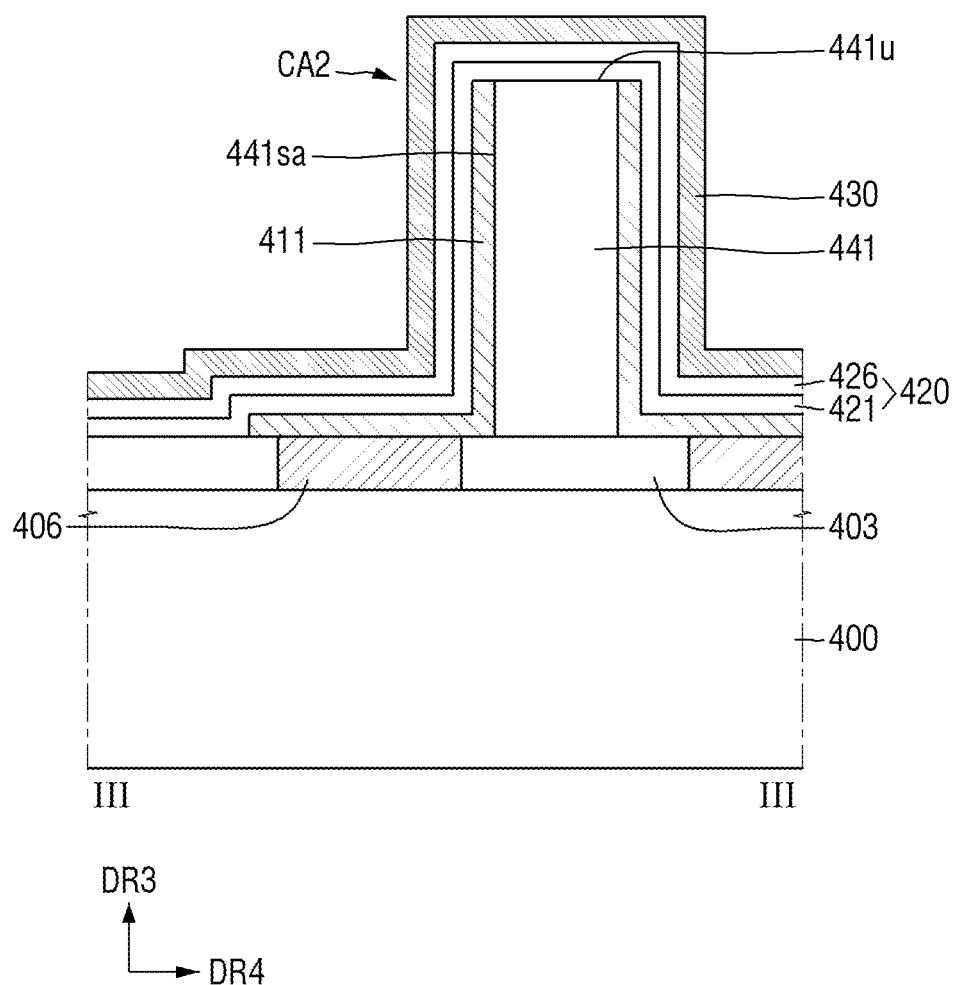
Figure 26:
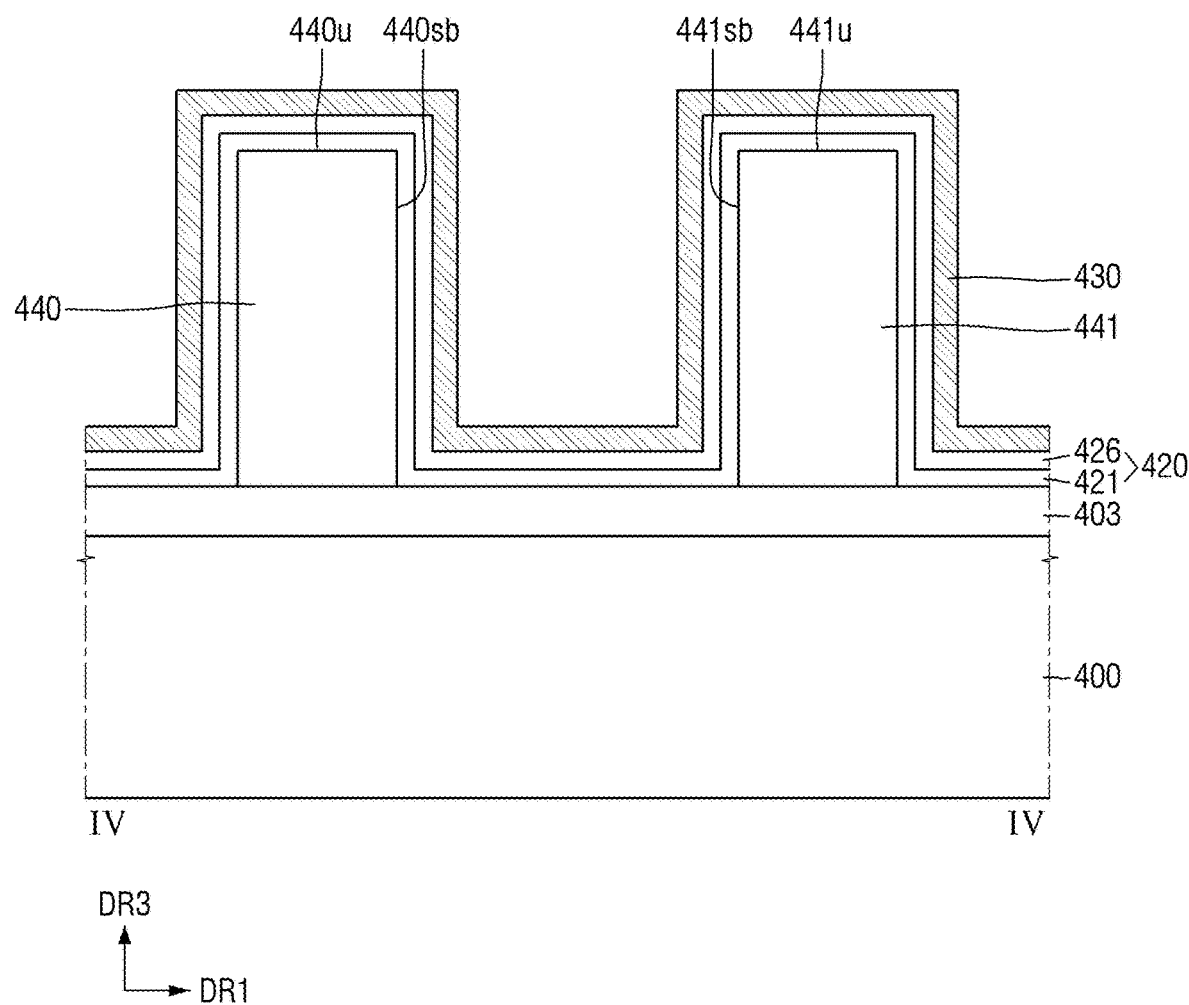

FIG. 23a is a layout diagram schematically illustrating an arrangement of cell capacitors of the semiconductor device according to some embodiments. FIG. 23b is a diagram illustrating that the capacitor dielectric film and the upper electrode are removed from FIG. 23a. FIGS. 24 to 26 are cross-sectional views taken along the lines II-II, III-III and IV-IV of FIG. 23a, respectively. For convenience of explanation, differences from those described with reference to FIGS. 19 and 20 will be mainly described. Referring to FIG. 23a, the semiconductor device according to some embodiments may include a plurality of cell capacitors arranged along a first direction DR1 and a fourth direction DR4.

Although the first direction DR1 and the fourth direction DR4 are illustrated as directions orthogonal to each other in FIG. 23a, the embodiments are not limited thereto.

Although each cell capacitor is illustrated to be rectangular from the viewpoint of plan view in FIG. 23a, the embodiments are not limited thereto.

Referring to FIGS. 23a to 26, the semiconductor device according to some embodiments may further include a first insulation pattern 440 and a second insulation pattern 441.

The first insulation pattern 440 and the second insulation pattern 441 may be formed on the substrate 400. The first insulation pattern 440 and the second insulation pattern 441 are disposed on the upper surface of the interlayer insulating film 403. The first insulation pattern 440 is separated from the second insulation pattern 441. The first insulation pattern 440 is adjacent to the second insulation pattern 441.

The first insulation pattern 440 includes a first sidewall 440sa and a second sidewall 440sb adjacent to each other. The first insulation pattern 440 includes an upper surface 440u connected to the first sidewall 440sa of the first insulation pattern and the second sidewall 440sb of the first insulation pattern. The first sidewall 440sa of the first insulation pattern may be connected to the second sidewall 440sb of the first insulation pattern.

The second insulation pattern 441 includes a first sidewall 441sa and a second sidewall 441sb adjacent to each other. The second insulation pattern 441 includes an upper surface 441u connected to the first sidewall 441sa of the second insulation pattern and the second sidewall 441sb of the second insulation pattern. The first sidewall 441sa of the second insulation pattern may be connected to the second sidewall 441sb of the second insulation pattern.

The second sidewall 441sb of the second insulation pattern may face the second sidewall 440sb of the first insulation pattern.

The first insulation pattern 440 and the second insulation pattern 441 may each include, for example, silicon oxide, silicon oxynitride, silicon nitride, and combinations thereof.

The first lower electrode 410 may extend along the first sidewall 440sa of the first insulation pattern. However, the first lower electrode 410 does not extend along the second sidewall 440sb of the first insulation pattern. The first lower electrode 410 includes a portion extending in parallel to the upper surface of the substrate 400. Alternatively, the first lower electrode 410 includes a portion extending along the upper surface of the interlayer insulating film 403.

The second lower electrode 411 may extend along the first sidewall 441a of the second insulation pattern. However, the second lower electrode 411 does not extend along the second sidewall 441sb of the second insulation pattern. The second lower electrode 411 includes a portion extending in parallel to the upper surface of the substrate 400. Alternatively, the second lower electrode 411 includes a portion extending along the upper surface of the interlayer insulating film 403.

The first lower electrode 410 and the second lower electrode 411 are not formed on the second sidewall 440sb of the first insulation pattern and the second sidewall 441sb of the second insulation pattern facing each other.

The second capacitor dielectric film 420 may be formed on the first lower electrode 410 and the second lower electrode 411. The second capacitor dielectric film 420 extends along the first lower electrode 410 and the second lower electrode 411.

The second capacitor dielectric film 420 extends along the second sidewall 440sb of the first insulation pattern and the second sidewall 441sb of the second insulation pattern in which the first lower electrode 410 and the second lower electrode 411 are not formed. The second capacitor dielectric film 420 extends along the upper surface 440u of the first insulation pattern and the upper surface 441u of the second insulation pattern.

In concluding the detailed description, those skilled in the art will appreciate that many variations and modifications may be made to the disclosed embodiments without substantially departing from the principles of the present inventive concepts. Therefore, the disclosed embodiments of the present inventive concepts are used in a generic and descriptive sense only and not for purposes of limitation.

What is claimed is:

1. A semiconductor device comprising:
   first and second electrodes apart from each other; and
   a capacitor dielectric film between the first electrode and the second electrode and including a first dielectric film and a second dielectric film, the first dielectric film and the second dielectric film being stacked,
   wherein the first dielectric film includes one of a first monometal oxide film and a first bimetal oxide film,
   the first dielectric film has an orthorhombic crystal system,
   the second dielectric film includes a paraelectric material,
   the second dielectric film has a monoclinic crystal system, and
   a dielectric constant of the capacitor dielectric film is greater than a dielectric constant of the second dielectric film.

2. The semiconductor device of claim 1, wherein each of the first dielectric film and the second dielectric film is a single film.

3. The semiconductor device of claim 1, wherein the first dielectric film includes a first sub-dielectric film and a second sub-dielectric film, and
   the first sub-dielectric film is between the second sub-dielectric film and the second dielectric film.

4. The semiconductor device of claim 3, wherein the second dielectric film includes a third sub-dielectric film and a fourth sub-dielectric film, and
   the third sub-dielectric film is between the fourth sub-dielectric film and the first dielectric film.

5. The semiconductor device of claim 1, wherein the capacitor dielectric film further includes a third dielectric film including a paraelectric material, and
   the first dielectric film is between the second dielectric film and the third dielectric film.

6. The semiconductor device of claim 1, wherein the first dielectric film and the second dielectric film form a dielectric film group, and
   the capacitor dielectric film includes a plurality of dielectric film groups.

7. The semiconductor device of claim 1, wherein the first monometal oxide film includes one of hafnium (Hf) and a rare earth metal of lanthanoids.

8. The semiconductor device of claim 1, wherein the first bimetal oxide film includes hafnium (Hf) and zirconium (Zr).

9. The semiconductor device of claim 1, wherein the second dielectric film includes one of a second monometal oxide film and a second bimetal oxide film, and
   a metal contained in the second monometal oxide film and the second bimetal oxide film includes at least one of hafnium (Hf) and zirconium (Zr).

10. The semiconductor device of claim 1, further comprising:
    a protection layer between the first electrode and the second electrode and including a metal oxide,
    wherein the protection layer is between the first electrode and the capacitor dielectric film and/or between the second electrode and the capacitor dielectric film.

11. The semiconductor device of claim 1, wherein capacitance of the capacitor dielectric film is greater than capacitance of the second dielectric film.

12. A semiconductor device comprising:
    first and second electrodes apart from each other;
    a capacitor dielectric film between the first electrode and the second electrode, and including a first dielectric film and a second dielectric film, the first dielectric film including a ferroelectric material, the second dielectric film including a paraelectric material and between the first dielectric film and the first electrode, the first dielectric film having an orthorhombic crystal system and the second dielectric film having a monoclinic crystal system;

at least one interfacial film including a conductive material and in contact with the first dielectric film; and a dielectric constant of the compactor dielectric film is greater than a dielectric constant of the second dielectric film.

13. The semiconductor device of claim 12, wherein the at least one interfacial film is between the second electrode and the first dielectric film.

14. The semiconductor device of claim 12, wherein the at least one interfacial film is between the first dielectric film and the second dielectric film.

15. The semiconductor device of claim 12, wherein the first dielectric film includes one of a monometal oxide film and a bimetal oxide film.

16. The semiconductor device of claim 15, wherein the monometal oxide film and the bimetal oxide film include the same metal element.

17. A semiconductor device comprising:
a first insulation pattern including a first sidewall and a second sidewall adjacent to each other on a substrate;
a second insulation pattern separate from the first insulation pattern on the substrate and including a third sidewall and a fourth sidewall adjacent to each other, the fourth sidewall of the second insulation pattern facing the second sidewall of the first insulation pattern;
a first lower electrode extending along the first sidewall of the first insulation pattern and not extending along the second sidewall of the first insulation pattern;
a second lower electrode extending along the third sidewall of the second insulation pattern and not extending along the fourth sidewall of the second insulation pattern;
a capacitor dielectric film extending along the first lower electrode, the second lower electrode, the second sidewall of the first insulation pattern and the fourth sidewall of the second insulation pattern, and including a first dielectric film and a second dielectric film, the first dielectric film and the second dielectric film being stacked; and
an upper electrode on the capacitor dielectric film,
wherein the first dielectric film includes one of a monometal oxide film and a bimetal oxide film,
the first dielectric film has an orthorhombic crystal system,
the second dielectric film includes a paraelectric material,
the second dielectric film having a monoclinic crystal system, and
a dielectric constant of the capacitor dielectric film is greater than a dielectric constant of the second dielectric film.

18. The semiconductor device of claim 17, wherein each of the first lower electrode and the second lower electrode includes a portion extending in parallel to an upper surface of the substrate.

19. The semiconductor device of claim 17, wherein each of the first dielectric film and the second dielectric film is a single film.

20. The semiconductor device of claim 17, wherein the monometal oxide film and the bimetal oxide film include a metal oxide including hafnium.

* * * * *